(12) United States Patent
Tashiro et al.

(10) Patent No.: US 6,203,332 B1
(45) Date of Patent: Mar. 20, 2001

(54) ATTACHMENT STRUCTURE OF SEMICONDUCTOR DEVICE SOCKET

(75) Inventors: Kazuhiro Tashiro; Daisuke Koizumi, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/461,425

(22) Filed: Dec. 16, 1999

(30) Foreign Application Priority Data

Dec. 22, 1998 (JP) .................................................. 10-365591
Nov. 11, 1999 (JP) .................................................. 11-321592

(51) Int. Cl.⁷ .......................... H01R 12/00; H01R 13/62; H01R 13/365; H01R 4/50; H05K 1/00
(52) U.S. Cl. .................................................. 439/71; 439/67
(58) Field of Search .................................. 439/70, 71, 73, 439/74, 67, 77, 525, 330, 331, 345, 346

(56) References Cited

U.S. PATENT DOCUMENTS

| | | | |
|---|---|---|---|
| 3,999,827 | * 12/1976 | Hutchison et al. ................... | 439/71 |
| 5,493,237 | * 2/1996 | Volz et al. ............................. | 324/754 |
| 6,033,235 | * 3/2000 | Ikeya ...................................... | 439/71 |
| 6,045,369 | * 4/2000 | Shin et al. ............................. | 439/71 |
| 6,083,013 | * 7/2000 | Yamagishi ............................. | 439/71 |

* cited by examiner

*Primary Examiner*—Gary F. Paumen
*Assistant Examiner*—Edwin A. León
(74) *Attorney, Agent, or Firm*—Staas & Halsey LLP

(57) ABSTRACT

An attachment structure between a semiconductor device socket and a test circuit substrate is provided. The semiconductor device socket includes a socket body and a contact film disposed therein. Extension conductive wires extended from a contact portion to be connected to a semiconductor device are formed on the contact film. The contact film is also provided with socket connectors connected to the extension conductive wires. The test circuit substrate is provided with circuit substrate connectors corresponding to the socket connectors. The socket connectors and the circuit substrate connectors are in a male-female connector relationship.

11 Claims, 26 Drawing Sheets

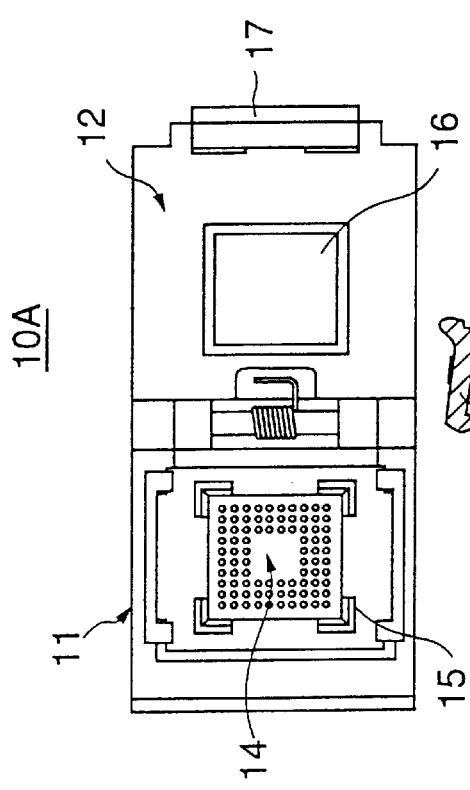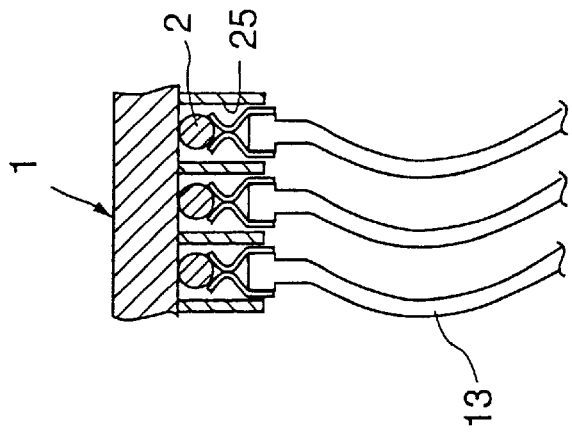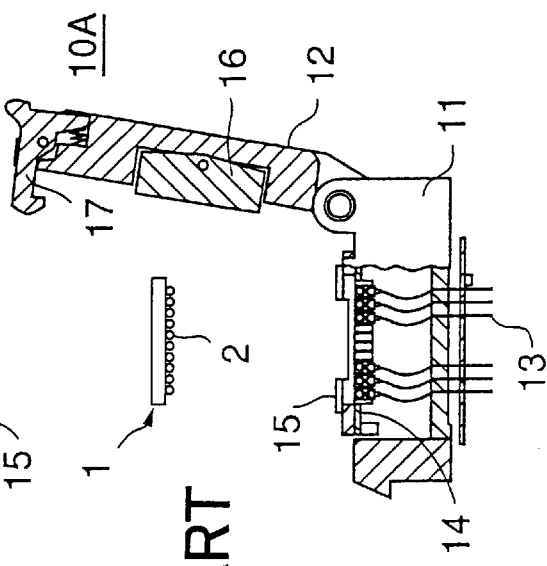

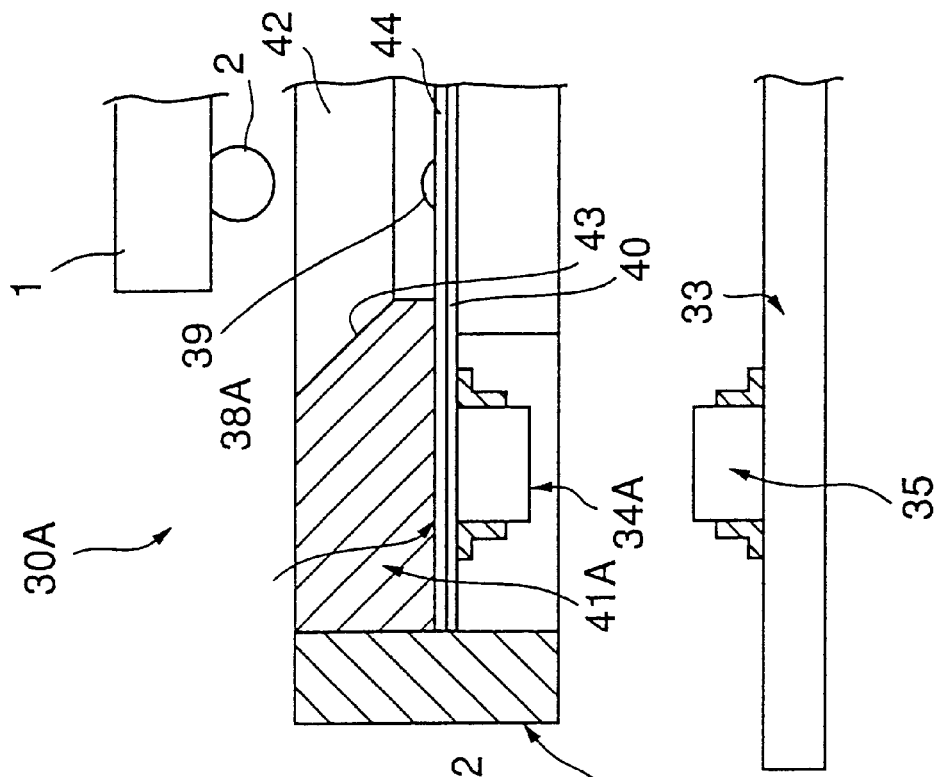
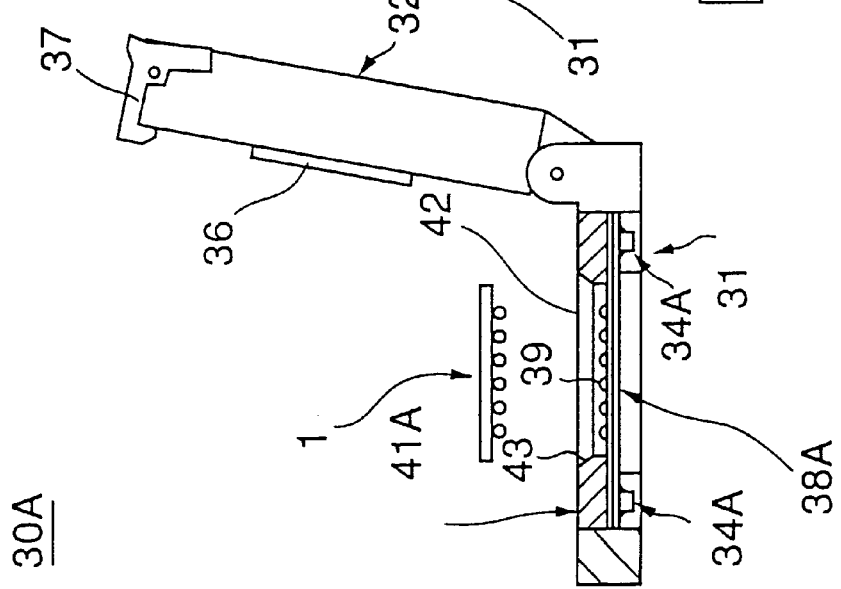

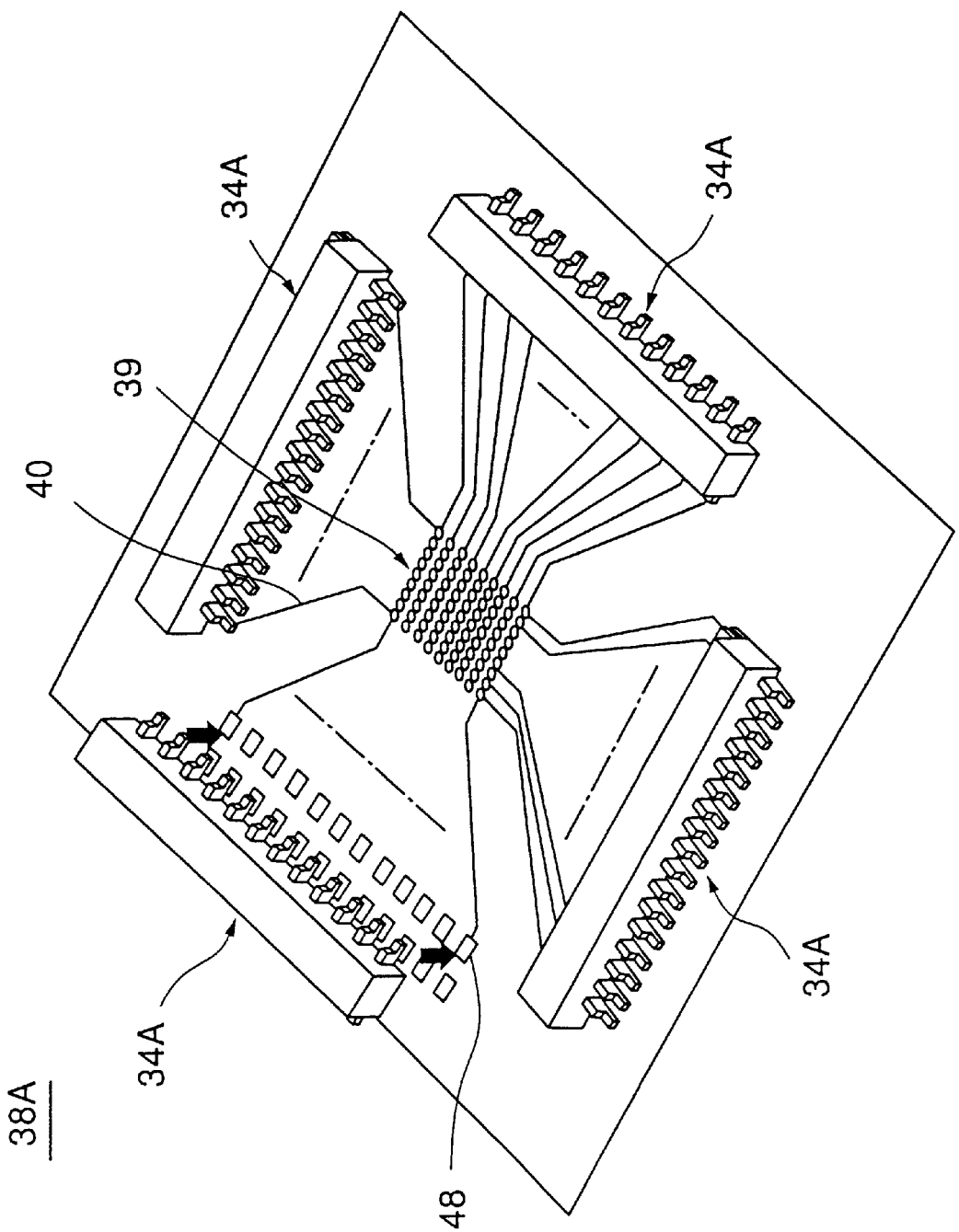

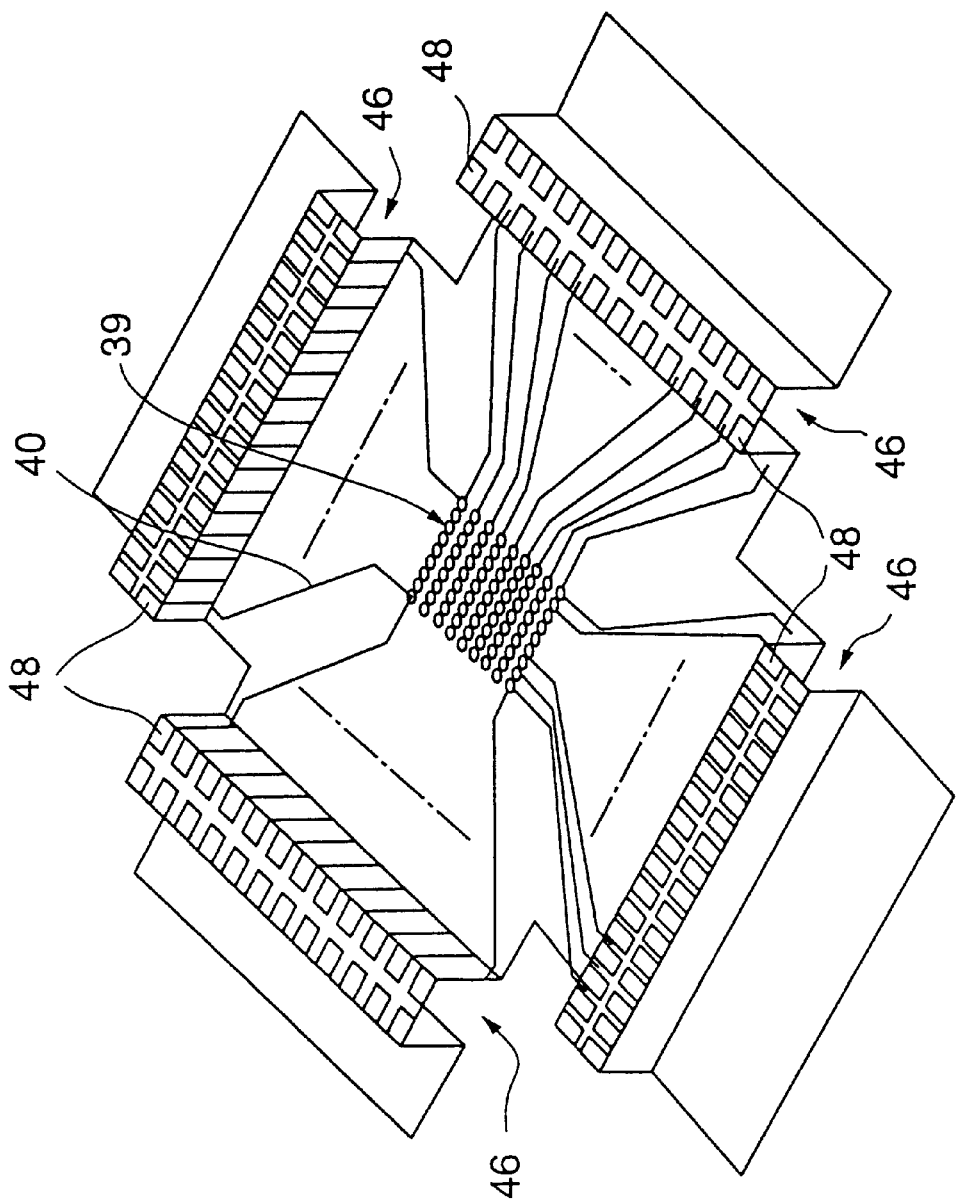

ATTACHMENT STRUCTURE OF SEMICONDUCTOR DEVICE SOCKET

BACKGROUND OF THE INVENTION

1. Field of the Invention

The present invention generally relates to attachment structures of semiconductor device sockets, and, more particularly, to an attachment structure of a semiconductor device socket attached to a test circuit substrate.

In recent years, there has been an increasing demand for lighter and smaller portable terminals and portable equipment such as portable telephones. Therefore, semiconductor devices mounted on such terminals and equipment need to be lighter and smaller accordingly. Also, as semiconductor devices are becoming smaller, the pitch of bumps is becoming extremely small.

When a reliability test is conducted on a semiconductor device, the semiconductor device is mounted on a semiconductor device socket. Therefore, semiconductor device sockets are also required to have very small pitch.

2. Description of the Related Art

FIGS. 1A to 1C show a conventional semiconductor device socket (hereinafter referred to as "socket"). A socket 10A is used for a test, such as a burn-in test for reliability, of a semiconductor device 1 having a BGA (Ball Grid Array) package structure, for instance.

As shown in FIGS. 1A and 1B, the socket 10A comprises a socket body 11, a lid body 12, and contacts 13. The socket body 11 accommodates the contacts 13, and is provided with a seat member 14. The seat member 14 has insertion holes 25 formed in positions corresponding to the positions of bumps 2 as shown in FIG. 1C. The upper ends of the contacts 13 are inserted into the insertion holes 25. The lower ends of the contacts 13 extend outwardly from the bottom surface of the socket body 11, and are soldered to a test circuit substrate (not shown). The seat member 14 is provided with guides 15 for guiding the mounting of the semiconductor device 1.

The lid body 12 is attached to the socket body 11, and can be freely opened and closed. The lid body 12 is closed after the semiconductor device 1 is set in the socket body 11. By closing the lid body 12, a presser portion 16 attached to the lid body 12 presses the semiconductor device 1 against the contacts 13. By doing so, the bumps 2 formed on the semiconductor device 1 can be surely connected to the contacts 13, so that the semiconductor device 1 can be electrically connected to the contacts 13. Reference numeral 17 indicates a latch which is engaged with the socket body 11 when the lid body 12 is closed, so as to prevent the lid body 12 from opening during a test of the semiconductor 1.

The conventional contacts 13 provided to the socket 10A are flat spring-type contacts formed by press molding. However, it is difficult to form very small flat spring-type contacts. As a result, the flat spring-type contacts are becoming less suitable for the semiconductor device 1 having the extremely small bump pitch.

In place of sockets having such flat spring-type contacts, contact film-type sockets have been suggested. FIGS. 2A and 2B show a socket 10B of a conventional contact film type. FIG. 2A shows the entire view of the socket 10B, and FIG. 2B shows the connection structure between contacts 20 and a test circuit substrate 25. In these figures, the socket 10B is a socket for BGA packaging.

A contact film 18 comprises a base film 26 made of polyimide or the like, and extension conductive wires 19 formed on the base film 26. The extension conductive wires 19 have the contacts 20 on their inner side, and a connection portion 27 on their outer side. The contacts 20 are connected to the bumps 2 of the semiconductor device 1, and therefore protrude upward penetrating the base film 26. The connection portion 27 is connected to flat spring contacts 22. Accordingly, the contacts 20 are connected to the connection portion 27 via the extension conductive wires 19. The contact film 18 is first fixed to a package guide 21, and then attached to the socket body 11. The contact film 18 has the same structure as TAB (Tape Automated Bonding) tape having a wiring pattern formed on a resin film. With this contact film 18, the extension conductive wires 19 and the contacts 20 can be made very small. Accordingly, the socket 10B can be used for the semiconductor device 1 having very small bump pitch.

With the socket 10B shown in FIGS. 2A and 2B, however, the connection structure between the contact film 18 and the test circuit substrate 25 is a problem. Generally, the flat spring contacts 22 are disposed in the socket body 11, and the contact film 18 and the test circuit substrate 25 are connected by the flat spring contacts 22. In this connection structure, the upper ends of the flat spring contacts 22 are connected to the connection portion 27 of the extension conductive wires 19, and the lower ends of the flat spring contacts 22 are soldered to the test circuit substrate 25. Thus, the contact film 18 and the test circuit substrate 25 are connected via the flat spring contacts 22.

When connecting the socket 10B to the test circuit substrate 25, it is necessary to make the flat spring contacts 22 elastic. Accordingly, the flat spring contacts 22 become long, and the wiring distance from the contacts 20 to the test circuit substrate 25 also becomes long. As a result, the electric characteristics, especially high-frequency characteristics, deteriorate due to the long wiring distance.

When the lid body 12 is closed with the semiconductor device 1 inside, the presser portion 16 presses the contacts 20 via the semiconductor device 1, a package guide presser portion 23 presses the package guide 21, and the flat spring contacts 22 press the connection portion 27. As a result, a very heavy load is applied to the socket 10B, which needs to have great strength.

For this reason, the conventional socket 10B has the socket body 11 and the lid body 12 that are thick enough to endure the heavy load. With such a structure, the socket 10B becomes larger in size, and the number of sockets 10B that can be mounted on one test circuit substrate 25 (a burn-in board, for instance) becomes smaller accordingly. Also, as one socket 10B becomes larger in size, it becomes more expensive.

FIGS. 3A and 3B show a socket 10C of another contact film type. This socket 10C has spring probes 24, instead of the flat spring contacts 22, for connecting the contact film 18 and the test circuit substrate 25. Each of the spring probes 24 has a spring inside, and the top end thereof is elastically pushed outward. Compared with the flat spring contacts 22, the spring probes 24 can be made small enough to be compatible with the minutely patterned contact film 18. However, because of the minuteness, the spring probes 24 are expensive, and result in high production costs when combined with the minutely patterned film contact 18.

Another problem with the socket 10C is that since the built-in spring pushes the contact portion 27, the load applied to the socket 10C is heavy. To endure such a heavy load, the socket 10C needs to be made large in size.

SUMMARY OF THE INVENTION

A general object of the present invention is to provide an attachment structure of a semiconductor device socket in which the above disadvantages are eliminated.

A more specific object of the present invention is to provide an attachment structure of a semiconductor device socket which can be made smaller and thinner, and can be produced at lower production costs.

The above objects of the present invention are achieved by an attachment structure of a semiconductor device socket comprising: a socket body; a circuit substrate to which the semiconductor device socket is attached; a contact film formed in the socket body and provided with conductive wires and a contact portion to which a semiconductor device is connected; socket connectors connected to the conductive wires formed on the contact film; and circuit substrate connectors formed on the circuit substrate for connections with the socket connectors. In this structure, the socket connectors and the circuit substrate connectors are in a male-female connector relationship.

The semiconductor device socket is attached to the circuit substrate by connecting the socket connectors to the circuit substrate connectors. Also, the socket connectors are disposed on the contact film, while the circuit substrate connectors are disposed on the circuit substrate. Accordingly, the contact film and the circuit substrate are in direct contact with the respective connectors, and the distance from the contact portion to the circuit substrate can be shortened compared with the prior art. Thus, electric characteristics (high-frequency characteristics, particularly) can be improved, so that the semiconductor device socket can be used for high-frequency testing.

Since the socket connectors and the circuit substrate connectors are in a male-female connector relationship, the semiconductor device socket can be secured to the circuit substrate by virtue of the self-holding force between corresponding connectors. Thus, the semiconductor device socket and the circuit substrate can be electrically and mechanically connected at once, thereby simplifying and miniaturizing the attachment structure.

The above and other objects and features of the present invention will become more apparent from the following description taken in conjunction with the accompanying drawings.

BRIEF DESCRIPTION OF THE DRAWINGS

FIGS. 1A to 1C illustrate a conventional semiconductor device socket of a flat spring type;

FIGS. 4A and 4B illustrate an attachment structure of a semiconductor device socket of a first embodiment of the present invention;

FIG. 5 illustrates a contact film used in the first embodiment of the present invention;

FIG. 11 shows a contact film used in the attachment structure of the second embodiment of the present invention;

DESCRIPTION OF THE PREFERRED EMBODIMENTS

Figure 2B:
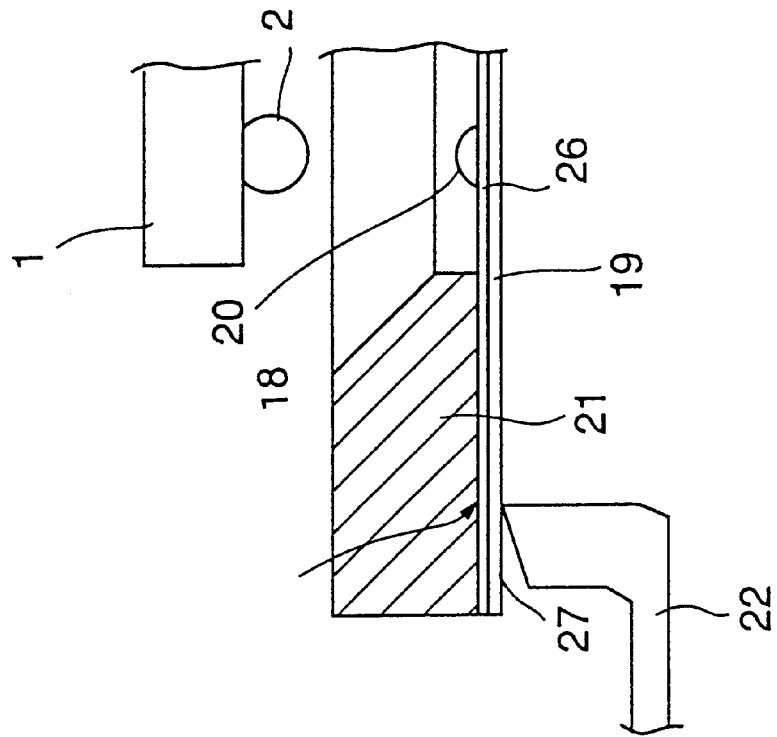
FIGS. 2A and 2B illustrate a conventional semiconductor device socket of a contact film type.

The following is a description of embodiments of the present invention, with reference to the accompanying drawings.

FIG. 4A shows an attachment structure of a first embodiment of the present invention, and FIG. 4B shows a socket 30A employed in the first embodiment. This embodiment is characterized by socket connectors 34A and circuit substrate connectors 35 employed for attaching the socket 30A to a test circuit substrate 33.

The socket 30A of this embodiment comprises a socket body 31, a lid body 32, a contact film 38A, a reinforcing board 41A, and the socket connectors 34A. A semiconductor device 1 of a BGA type having bumps 2 as external connection terminals is mounted to the socket 30A.

The socket body 31 is provided with the reinforcing board 41A having the contact film 38A on the inner surface thereof. Although the reinforcing board 41A is fixed to the socket body 31 by adhesive in this embodiment, a reinforcing member may be detachably attached to the socket body 31.

The lid body 32 is attached to the socket body 31, and can be opened and closed. After the semiconductor device 1 is mounted to the socket body 31, the lid body 32 is closed so that a presser member 36 provided to the lid body 32 presses the semiconductor device 1 against contact members 39 formed on the contact film 38A. By doing so, the bumps 2 formed on the semiconductor device 1 are electrically connected to the contact members 39. Reference numeral 37 indicates a latch which is engaged with the socket body 31 when the lid body 32 is closed, thereby preventing the lid body 32 from opening during a test of the semiconductor device 1.

FIG. 5 is an enlarged view of the contact film 38A. This figure shows the reverse surface of the contact film 38A, i.e., the surface opposite to the surface to which the semiconductor device 1 is mounted.

The contact film 38A has extension conductive wires 40 formed on a base film 44 made of polyimide and the like. The contact members 39 protrude upward penetrating the base film 44 in the positions where the bumps 2 of the semiconductor device 1 are in touch with the inner side of the extension conductive wires 40. The socket connectors 34A and connection portions 48 are formed on the outer ends of the extension conductive wires 40. Accordingly, the contact members 39 are connected to the connection portions 48 via the extension conductive wires 40. Since the extension conductive wires 40 and the contact members 39 can be made very small, the contact film 38A is compatible with the minutely formed semiconductor device 1.

The socket connectors 34A are disposed at the connection portions 48 formed on the contact film 38A. As will be described later, the socket connectors 34A electrically connect the contact members 39 (or the contact film 38A) to the test circuit substrate 33. In this embodiment, substrate connectors are used as the socket connectors 34A. Substrate connectors are used to electrically connect a pair of printed wiring boards in an electronic device, and also to mechanically maintain the pair of printed wiring boards. Such substrate connectors are widely utilized in electronic devices, and are cost-effective. Accordingly, substrate connectors used as the socket connectors 34A do not raise the cost of the socket 30A. Also, in response to a demand for smaller-height electronic devices, substrate connectors are becoming smaller in height. By employing substrate connectors, the socket connectors 34A can be made smaller in height.

Figure 6:
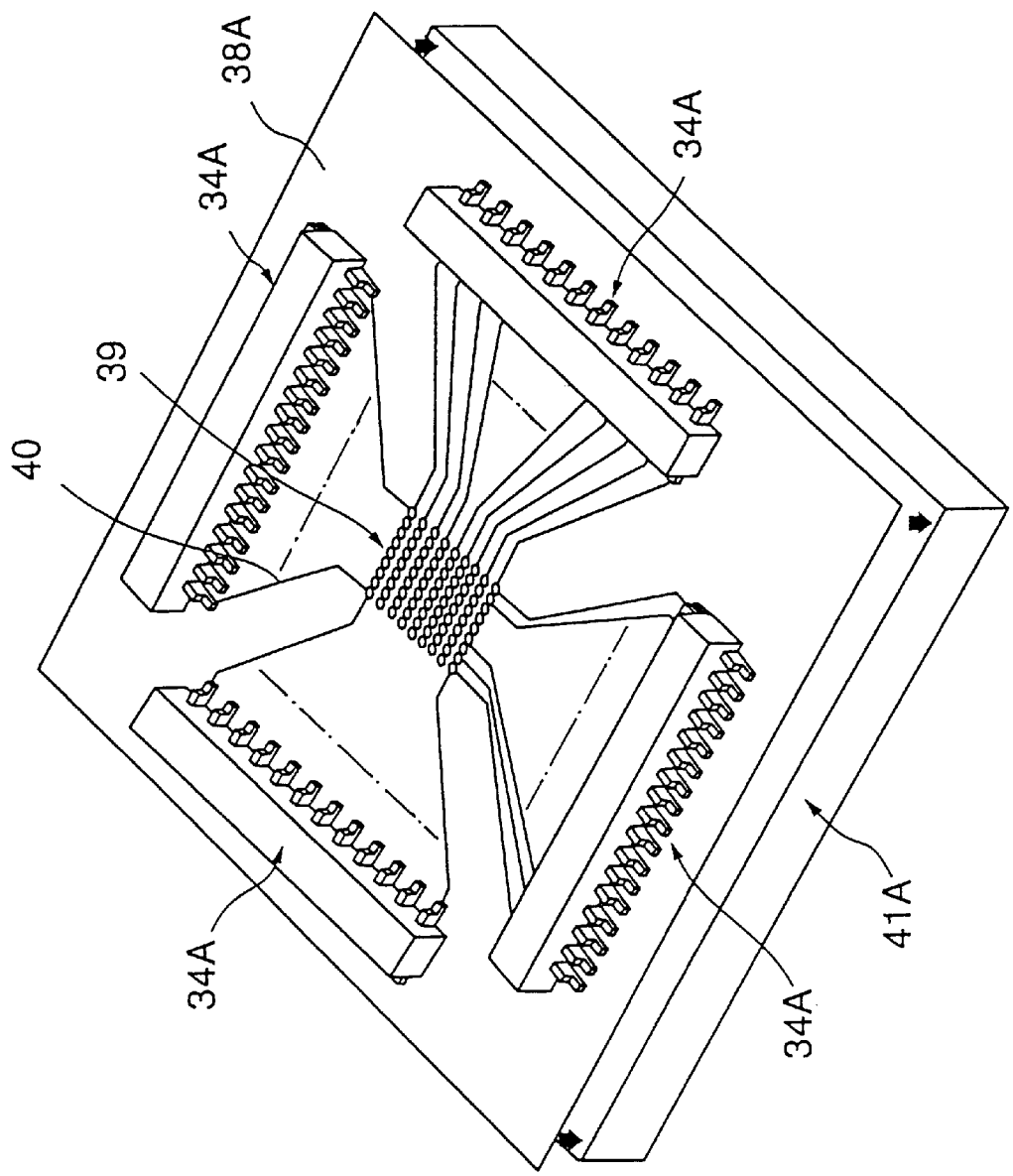
FIG. 6 shows a contact film attached to a reinforcing board of the first embodiment of the present invention.
Figure 7:
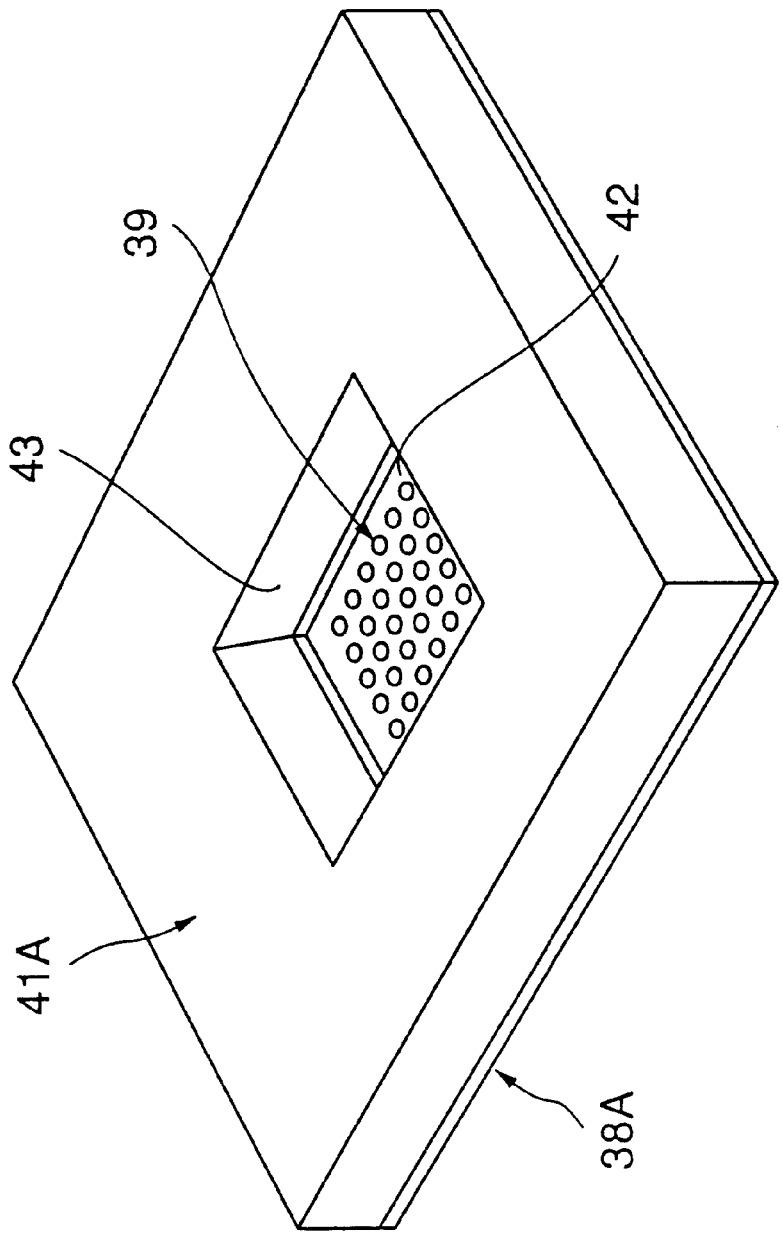
FIG. 7 illustrates the reinforcing board of the first embodiment of the present invention.

The contact film having the above structure is fixed to the reinforcing board 41A by adhesive, as shown in FIGS. 6 and 7. This reinforcing board 41A is formed from a hard resin material, and has an opening 42 in its center. When the contact film 38A is attached to the reinforcing board 41A, the opening 42 faces the contact members 39. As a result, the contact members 39 can be exposed through the opening 42, and when the semiconductor device 1 is fitted in the opening 42, the bumps 2 of the semiconductor device 1 can be electrically connected to the contact members 39.

The inner peripheral surfaces of the opening 42 are tapered, and these tapered surfaces serve as positioning guides 43 (hereinafter referred to as package guides) for positioning the bumps 2 of the semiconductor device 1 onto the contact members 39. When the semiconductor device 1 is connected to the contact film 38A, the semiconductor device 1 is guided into the opening 42 by the package guides 43, thereby easily and surely positioning the bumps 2 to the contact members 39.

The contact film 38A is attached to the reverse side (opposite to the side of the test circuit substrate 33) of the reinforcing board 41A. As the reinforcing board 41A is formed from a hard resin material, the reinforcing board 41A serves as a reinforcing member for reinforcing the contact film 38A. Even though the contact film 38A has elasticity, no bending or deformation occurs in the contact film 38A at the time of connecting of the semiconductor device 1. The reinforcing board 41A does not hinder the attachment of the semiconductor device 1, because the semiconductor device 1 is connected to the contact members 39 through the opening 42.

The reinforcing board 41A having the contact film 38A is fixed to the socket body 31, thereby completing the socket 30A shown in FIGS. 4A and 4B. The socket 30A of this embodiment does not comprise the contacts 13, the flat spring contacts 22, and the spring probes 2, which are included in the large-height socket body 11 of the sockets 10A to 10C of the prior art shown in FIGS. 1A to 3B. Also, the socket connectors 34A used in the electric connection between the contact film 38A and the test circuit substrate 33 are small in height. Accordingly, the size (especially, the height) of the socket 30A is far smaller than any of the sockets 10A to 10C of the prior art.

Meanwhile, the test circuit substrate 33 is a printed wiring board or a ceramic wiring board. The test circuit substrate 33 has the circuit substrate connectors 35 formed in the positions corresponding to the socket connectors 34A. The circuit substrate connectors 35 are small-height substrate connectors that match the socket connectors 34A. The circuit substrate connectors 35 and the socket connectors 34A make pairs. More specifically, in this embodiment, the socket connectors 34A are female connectors, and the circuit substrate connectors 35 are male connectors. The relationship between the socket connectors 34A and the circuit substrate connectors 35 can be reversed.

To attach the socket 30A to the test circuit substrate 33 having the above structure, the socket connectors 34A are positioned and engaged with the circuit substrate connectors 35.

Figure 8:
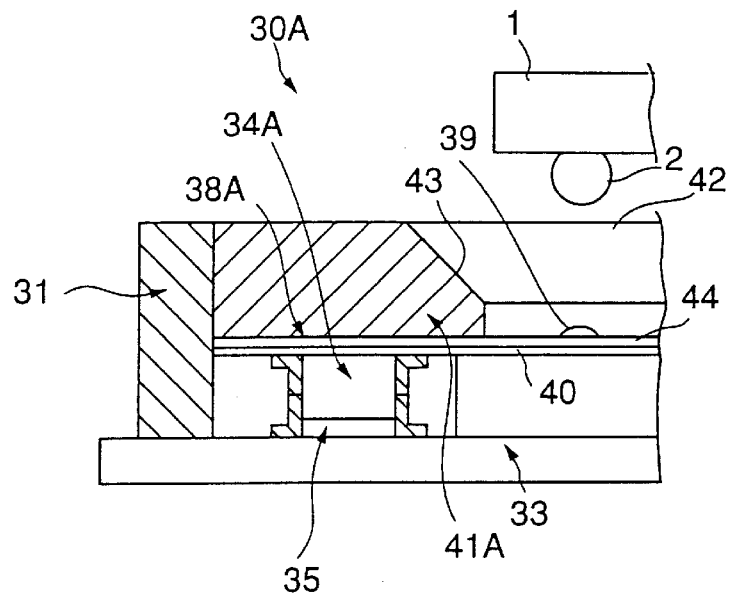
FIG. 8 illustrates the semiconductor device socket attached to a test circuit substrate in the attachment structure of the first embodiment of the present invention.

FIG. 8 shows one socket connector 34A and one circuit substrate connector 35 engaged with each other. In this figure, the contact film 38A is electrically connected to the test circuit substrate 33 via the socket connectors 34A and the circuit substrate connectors 35.

Figure 2A:
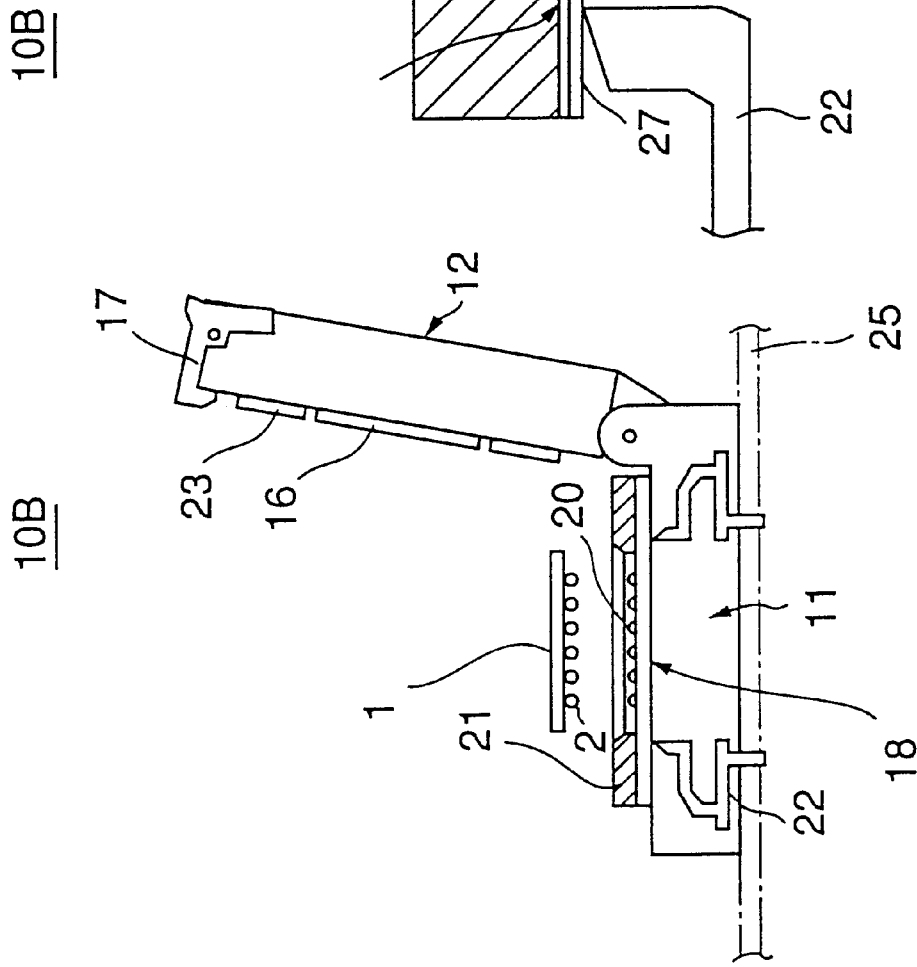
Figure 3A:
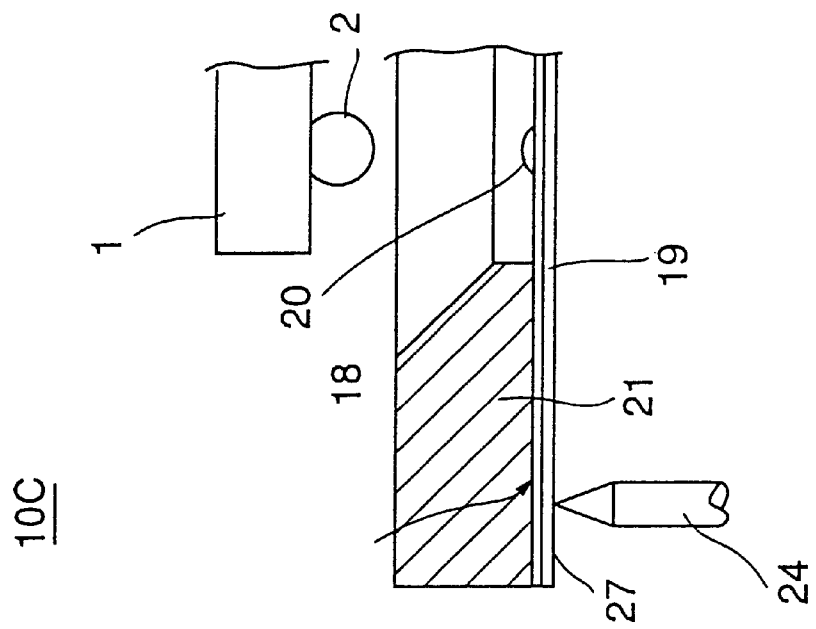
FIGS. 3A and 3B illustrate a conventional semiconductor device socket of another contact film type.
Figure 3B:
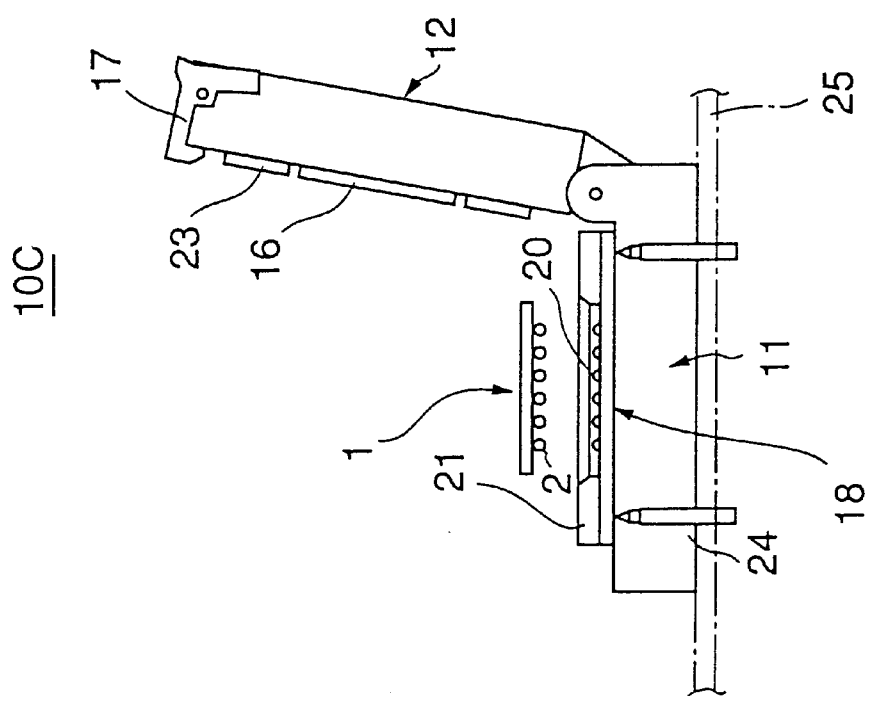

In the conventional sockets 10B and 10C shown in FIGS. 2 and 3, the flat spring contacts 22 or the spring probes 24 need to be pressed against the connection portion 27 so as to connect the contact film 18 to the test circuit substrate 25. Because of this, it is necessary to provide an elastic portion to each of the flat spring contacts 22 or each of the spring probes 24, and such an elastic portion adds to the height.

On the other hand, in this embodiment, the contact film 38A can be connected to the test circuit substrate 33 by connecting the socket connectors 34A and the circuit substrate connectors 35. Since the socket connectors 34A are respectively engaged with the circuit substrate connectors 35, no elastic portions need to be provided to the socket connectors 34A and the circuit substrate connectors 35. Thus, the socket connectors 34A and the circuit substrate connectors 35 are small in height.

With such socket connectors 34A and circuit substrate connectors 35, the electrical wiring distance between the contact portion 39 and the test circuit substrate 33 can be made shorter. By making the wiring distance shorter, the electric characteristics between the socket 30A and the test circuit substrate 33 can be improved, and become sufficiently suitable for high-frequency testing.

Since the socket connectors 34A and the circuit substrate connectors 35 are male and female connectors, the socket 30A can be secured to the test circuit substrate 33 by the connecting force between the socket connectors 34A and the circuit substrate connectors 35. Accordingly, the socket 30A and the test circuit substrate 33 can be electrically and mechanically connected at the same time. The attachment structure of this embodiment is thus smaller and simpler than in the prior art.

When the conventional sockets 10A to 10C are fixed to the test circuit substrate 25, the lower ends of the contacts 12 and 22, or the lower ends of the spring probes 24 need to be soldered to the test circuit substrate 25. On the other hand, this embodiment does not require the soldering operation. The attachment structure of this embodiment is thus simplified, and the production costs are lowered.

Even if the socket 30A deteriorates with time or is broken, the socket 30A can be easily detached from the test circuit substrate 33 in the attachment structure using the socket connectors 34A and the circuit substrate connectors 35. Accordingly, the attachment structure of this embodiment is also easier in maintenance.

Figure 9:
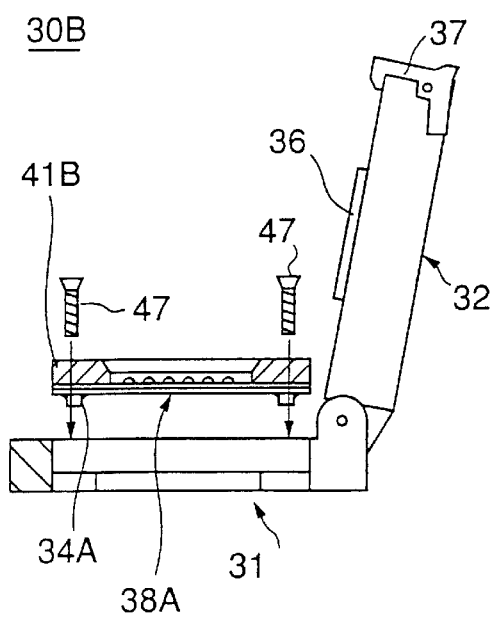
FIG. 9 illustrates a modification of the first embodiment of the present invention.
Figures 10A, 10B:
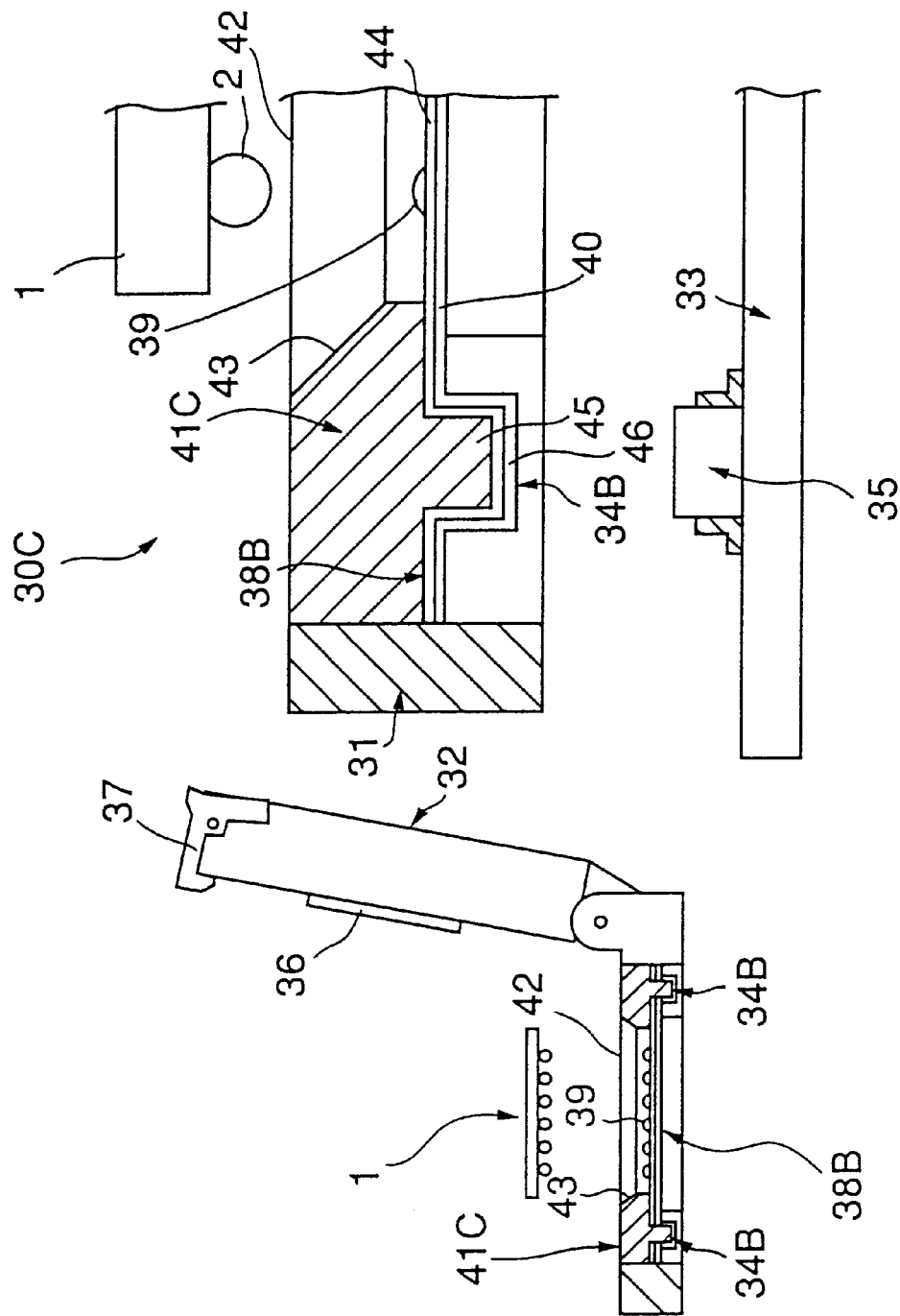
FIGS. 10A and 10B illustrates an attachment structure of a second embodiment of the present invention.
Figure 12:
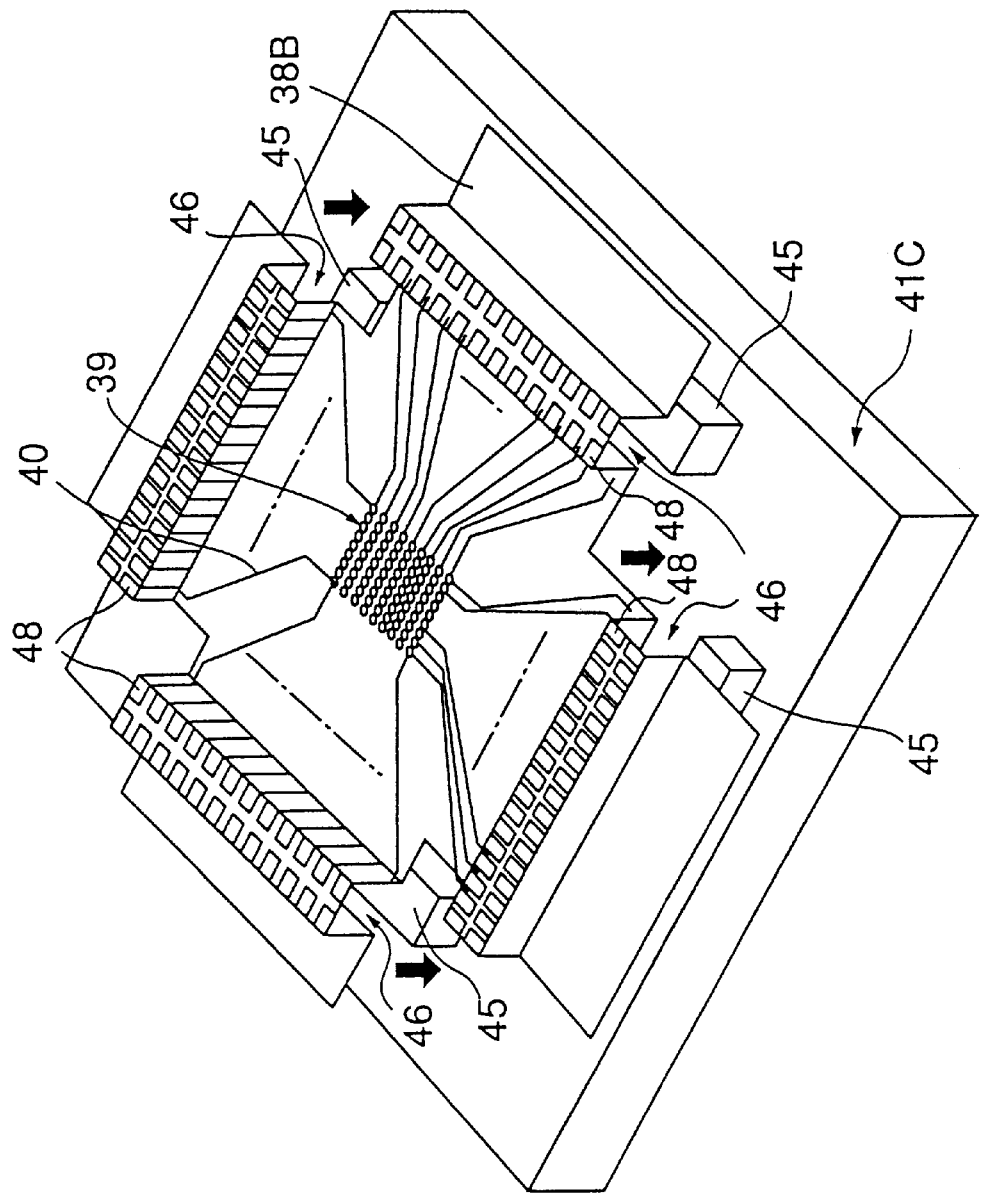
FIG. 12 illustrates an attachment process of the contact film to a reinforcing board of the second embodiment of the present invention.

FIG. 9 shows a socket 30B used in a modification of the attachment structure of the first embodiment. In FIG. 9, the same components as in FIGS. 4A to 8 are indicated by the same reference numerals.

In the socket 30A of the first embodiment, the reinforcing board 41A is bonded to the socket body 31. On the other hand, the socket 30B has a fixing mechanism in which a reinforcing board 41B is detachably fixed to the socket body 31. The fixing mechanism is formed by fixing screws 47. The reinforcing board 41B can be secured to the socket body 31 by tightening the fixing screws 47, and the reinforcing board 41B can be detached from the socket body 31 by removing the fixing screws 47.

Even if the contact film 38A deteriorates with time, it can be readily replaced in this modification. Also, it is not necessary to replace the entire socket 30B. Only the reinforcing board 41B having the contact film 38A formed thereon should be replaced. Thus, the workability in maintenance can be improved, and the maintenance costs can be reduced. Furthermore, with the reinforcing board 41B and the contact film 38A being freely replacable, the socket 30B becomes compatible with various types of semiconductor device. For instance, a plurality of contact films are prepared to accommodate differences in the number of terminals, the pitch of bumps, or the package configuration, so that the socket 30B can be compatible with various types of semiconductor device by simply exchanging the contact films.

FIGS. 10A to 12 illustrate an attachment structure of a second embodiment of the present invention.

In the first embodiment, substrate connectors are used as the socket connectors 34A disposed on the contact film 38A. In the second embodiment, on the other hand, protrusions 45 are formed in the positions of socket connectors 34B on a reinforcing board 41C, and a contact film 38B is bonded along the protrusions 45, thereby forming the socket connectors 34B.

Since the protrusions 45 are integrally formed at the time of formation of the reinforcing board 41C made of a hard resin material, the forming of the protrusions 45 does not further complicate the production procedures of the reinforcing board 41C, and does not increase the production costs. The contact film 38B has the extension conductive wires 40 formed on the base film 44 made of a resin material such as polyimide. Because of its elasticity, the contact film 38B can be readily bonded along the protrusions 45.

More specifically, the contact film 38B is provided with bend portions 46 formed by bending the contact film 38B along the protrusions 45, as shown in FIG. 11. The contact film 38B is then positioned with the protrusions 45 formed on the reverse side of the reinforcing board 41C, and is fixed thereto by adhesive. Here, the connection portions 48 of the contact film 38B should be respectively situated on the upper surfaces of the protrusions 45.

Since the socket connectors 34B of this embodiment are formed by bonding the contact film 38B along the protrusions 45 formed on the reinforcing board 41C, the contact film 38B itself constitutes part of the socket connectors 34B. Accordingly, in this embodiment, there is no need to provide separate connectors (substrate connectors) as is required in the first embodiment, and the semiconductor device socket 30C can be produced at lower production costs.

Figure 13:
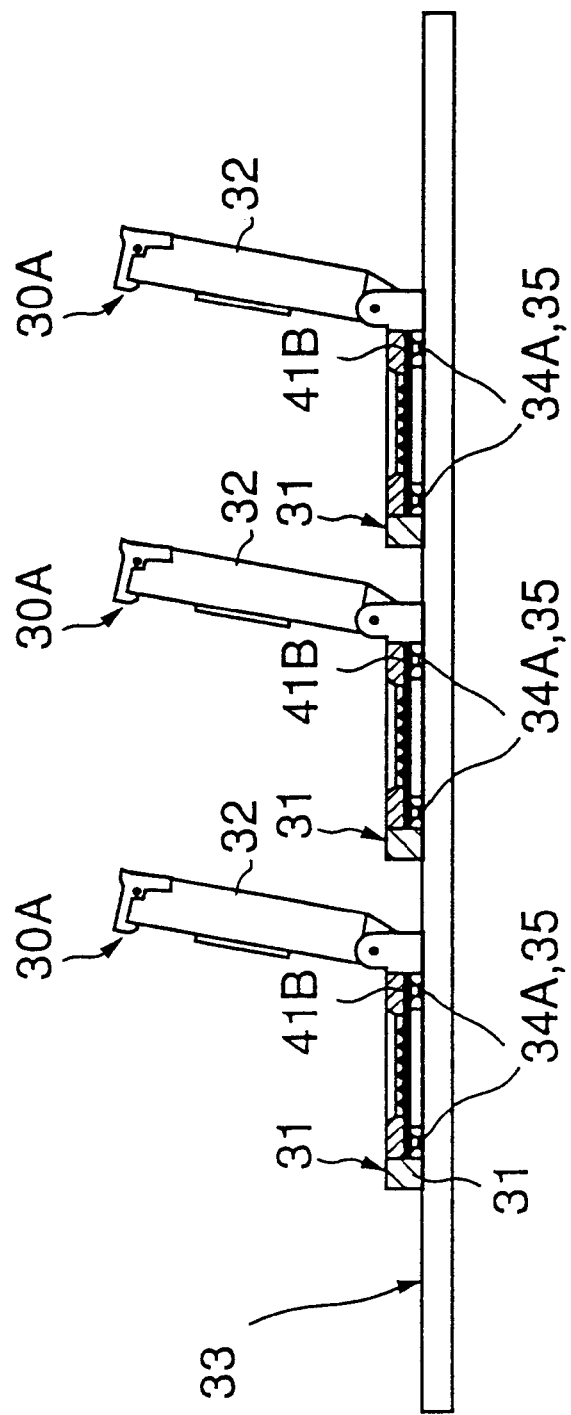
FIG. 13 illustrates an attachment structure of a third embodiment of the present invention.

FIG. 13 illustrates an attachment structure of a third embodiment of the present invention. In this figure, a plurality of sockets 30A (30B, 30C) are mounted on one test circuit substrate 33. In the positions of the sockets 30A on the test circuit substrate 33, the circuit substrate connectors 35 are disposed.

As the plurality of semiconductor device sockets 30A are mounted on the test circuit substrate 33 in this embodiment, a plurality of semiconductor devices 1 can be collectively tested, thereby improving the test efficiency. With this structure, a test circuit substrate 33 having a larger number of burn-in boards can be employed. Accordingly, this structure is suitable particularly in tests, such as a burn-in test and an environmental test, in which a load is applied to a plurality of semiconductor devices 1 at the same time.

Figure 14:
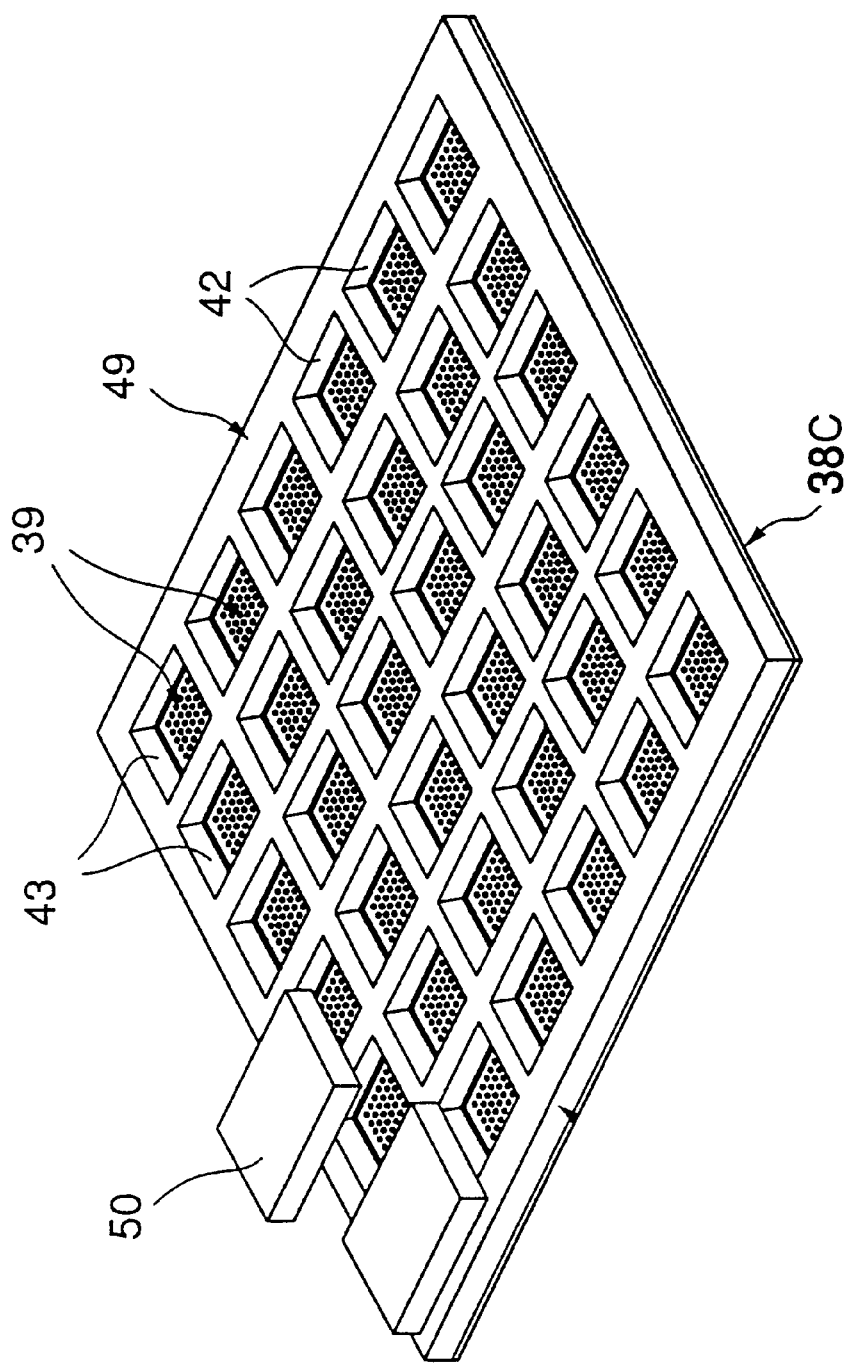
FIG. 14 illustrates a socket used in an attachment structure of a fourth embodiment of the present invention.
Figure 15:
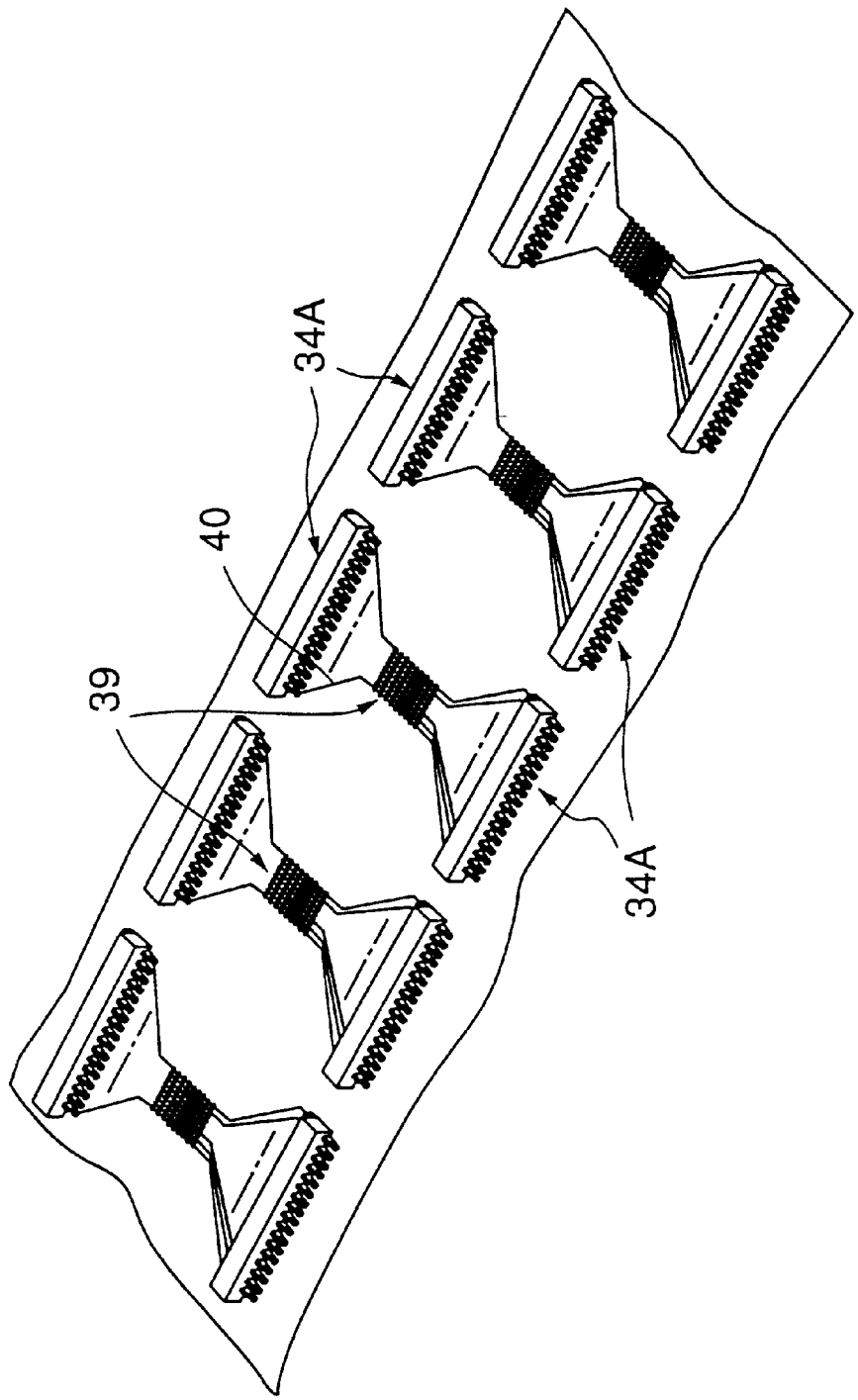
FIG. 15 is an enlarged view of part of a contact film used in the attachment structure of the fourth embodiment of the present invention.
Figure 16:
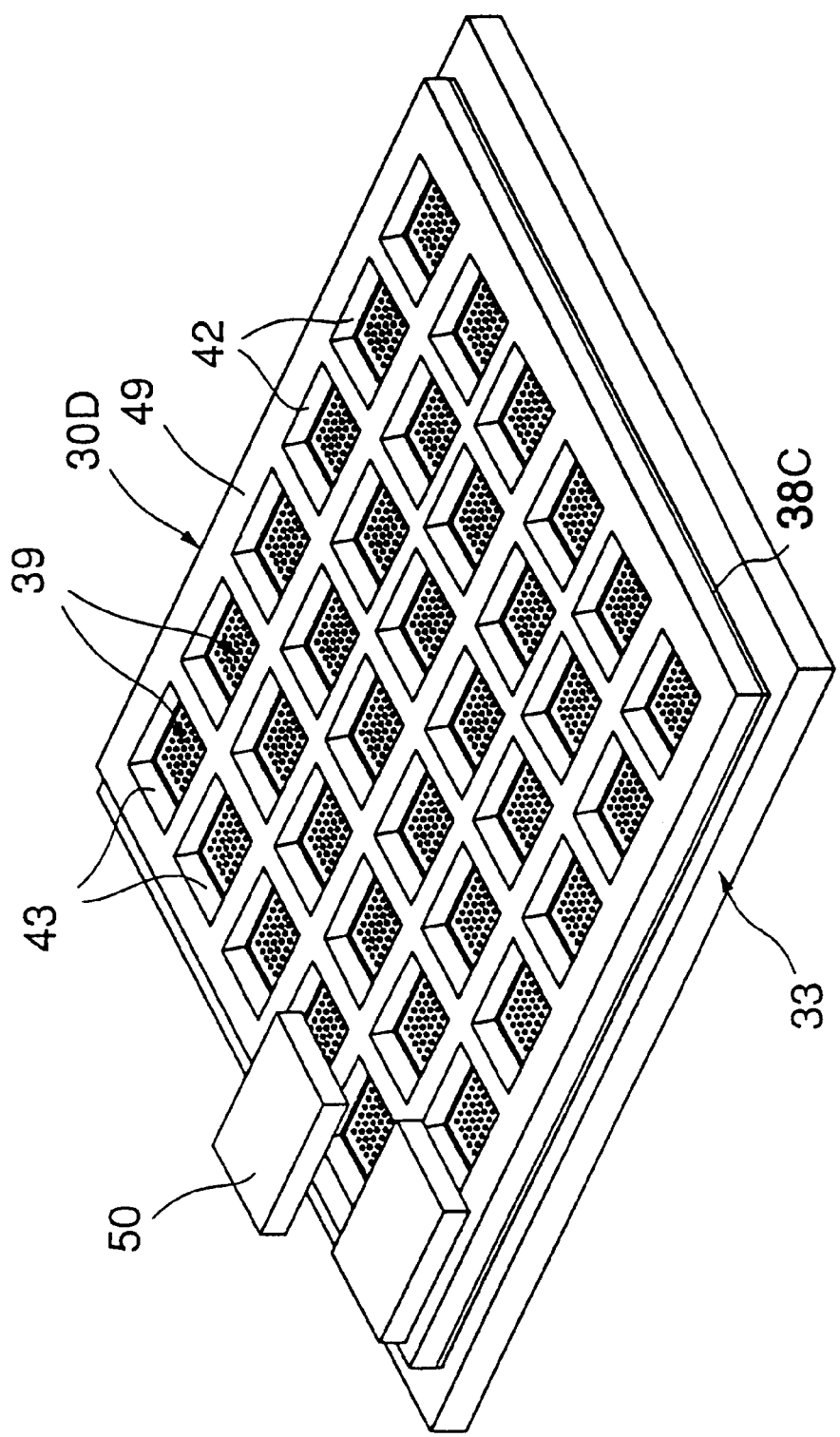
FIG. 16 illustrates a socket attached to a test circuit substrate in the attachment structure of the fourth embodiment of the present invention.

FIGS. 14 to 16 illustrate an attachment structure of a fourth embodiment of the present invention. In this embodiment, a plurality (36, in this embodiment) of openings 42 are formed in a socket 30D disposed on the test circuit substrate 33. The contact portions 39 are arranged in each of the openings 42. Accordingly, a plurality of semiconductor devices 1 can be collectively tested with only one socket 36.

In the figures, reference numeral 50 indicates covers which cover the openings 42 after the semiconductor devices 1 are respectively mounted on the openings 42, and which presses the semiconductor devices 1 against the contact portions 39.

The socket 30D is made up of a socket body 49 and a contact film 38C. The socket body 49 has the same functions as the socket 31 and the reinforcing boards 41A and 41B of the previous embodiments. The socket body 49 has the plurality of openings 42. Each of the openings 42 has the package guide 43 for guiding the semiconductor device 1 to be mounted.

FIG. 15 is an enlarged view of part of the contact film 38C of this embodiment. As can be seen from the figure, a plurality of contact portions 39 are formed on the contact film 38C. The contact film 38C is also provided with extension conductive wires 40 and the socket connectors 34A corresponding to the contact portions 39. Although substrate connectors are used as the socket connectors 34A in this embodiment, it is possible to employ the socket connectors 34B used in the second embodiment shown in FIGS. 10A to 12.

In the attachment structure of this embodiment, the contact portions 39 and the socket connectors 34A corresponding to the contact portions are formed on the contact film 38C to be bonded to the socket 30D. Accordingly, a plurality of semiconductor devices 1 can be mounted on the one socket 30D, and can be tested collectively. Thus, the testing efficiency can be improved. Also, compared with the structure shown in FIG. 13, the socket 30D and the test circuit substrate 33 can be made smaller, because a plurality of semiconductor devices 1 can be mounted on the one socket body 49.

Figure 17:
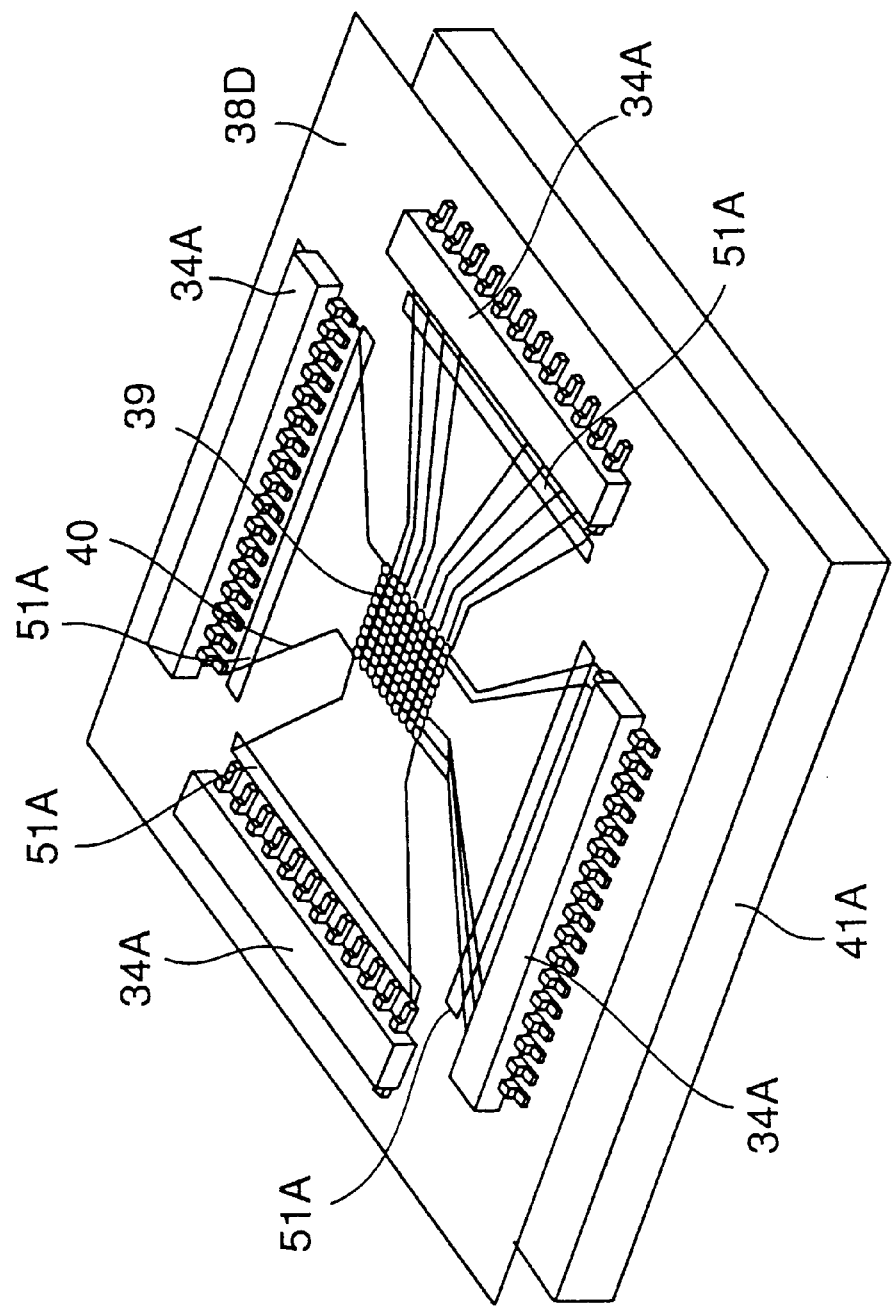
FIG. 17 illustrates a socket in an attachment structure of a fifth embodiment of the present invention.
Figure 18:
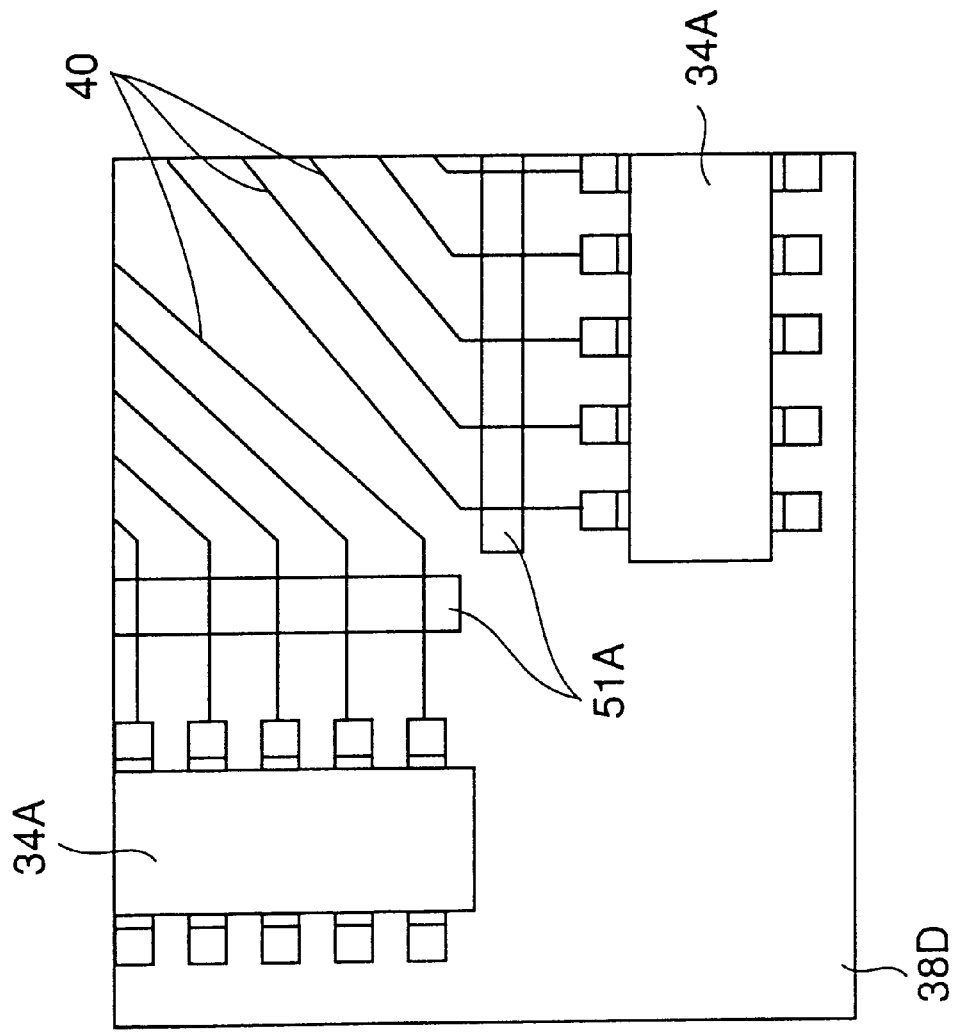
FIG. 18 is an enlarged view of part of the socket of the fifth embodiment of the present invention.
Figure 19:
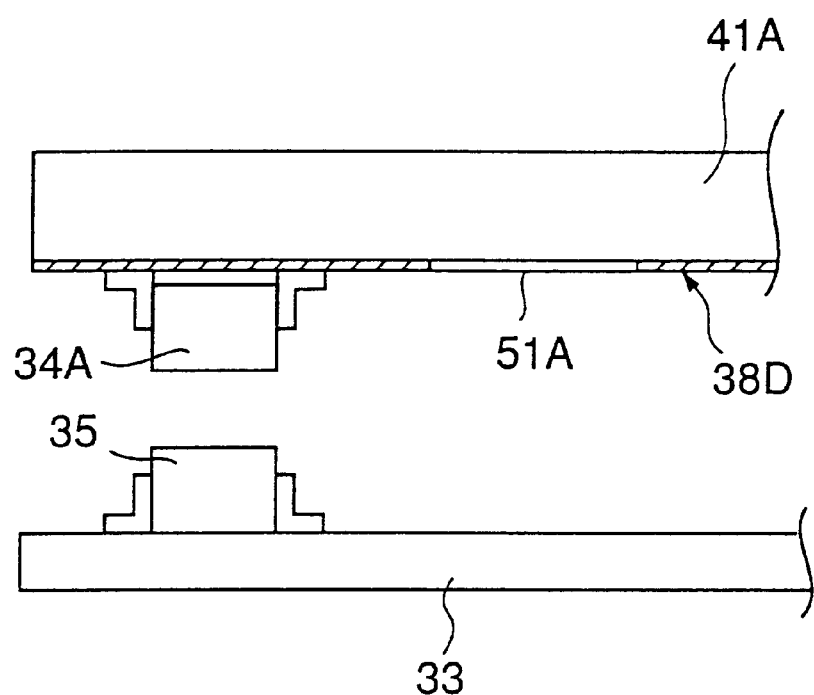
FIG. 19 is an enlarged side view of part of the attachment structure of the fifth embodiment of the present invention.

FIGS. 17 to 19 illustrate an attachment structure of a fifth embodiment of the present invention. This embodiment is characterized by clearances 51A formed in a contact film 38D.

Each of the clearances 51A has a long rectangular shape, and is situated in parallel with each corresponding socket connector 34A. The clearances 51A are formed on inner sides of the socket connectors 34A. Also, the contact film 38D is provided with a plurality of extension conductive wires 40 for connecting the contact portions 39 and the socket connectors 34A. Accordingly, the clearances 51A are situated on the way of each of the extension conductive wires 40.

As shown in FIG. 18, each of the extension conductive wires 40 crosses over one of the clearances 51A, so that the clearances 51A do not hinder the arrangement of the extension conductive wires 40. Also, the clearances 51A are formed collectively at the time of formation of the contact film 38D. Accordingly, the clearances 51A never complicate the formation procedures of the contact film 38D.

The clearances 51A formed in the contact film 38D ensure precise connections between the semiconductor device 1 and the contact portion 39. The reasons for this are as follows:

As described before, the reinforcing board 41A bonded to the contact film 38D prevents the elastic contact film 38D from being bent or distorted at the time of connecting the semiconductor device 1. Thus, the semiconductor device 1 can be surely connected to the contact portion 39. However, this actually happens only when the socket connectors 34A and the circuit substrate connectors 35 are highly accurately arranged in the predetermined positions. In practice, a positional shift occurs within a range of allowable error. In a case where the pitch of the contact pins of the socket and circuit substrate connectors 34A and 35 is relatively wide, a small positional shift does not cause a problem. In a case where the pitch of the contact portion 39 and the bumps 2 is narrow in a high-density semiconductor device, a positional shift adversely influences the connection between the bumps 2 and the contact portion 39.

If there is a positional shift among the socket connectors 34A and the circuit substrate connectors 35, displacement occurs in the contact film 38D at the time of attaching and detaching the socket connectors 34A and the circuit substrate connectors 35. The displacement appears as wrinkling or sagging in the contact film 38D. Such wrinkling or sagging causes gaps between the bumps 2 and the contact portion 39, resulting in imperfect contact between the semiconductor device and the socket (the contact portion 39, more specifically).

The clearances 51A formed in the contact film 38D of this embodiment can be deformed to absorb displacement of the contact film 38D at the time of attaching and detaching the connectors. The clearances 51A thus serve as displacement absorb portions that absorb displacement of the contact film 38D.

The displacement caused in the contact film 38D at the time of attaching and detaching the connectors normally occurs in the positions of the socket connectors 34A. In the contact film 38D, wrinkling and sagging are most unwanted in the positions of the socket connectors 34A. Therefore, each of the clearances 51A has a rectangular shape, and is situated in parallel with the socket connectors 34A. Also, the clearances are formed on the contact portion side of the socket connectors 34A. Thus, the contact portion 39 can be prevented from being wrinkled or sagged, and the semiconductor device can be accurately and surely connected to the contact portion 39.

Figure 20:
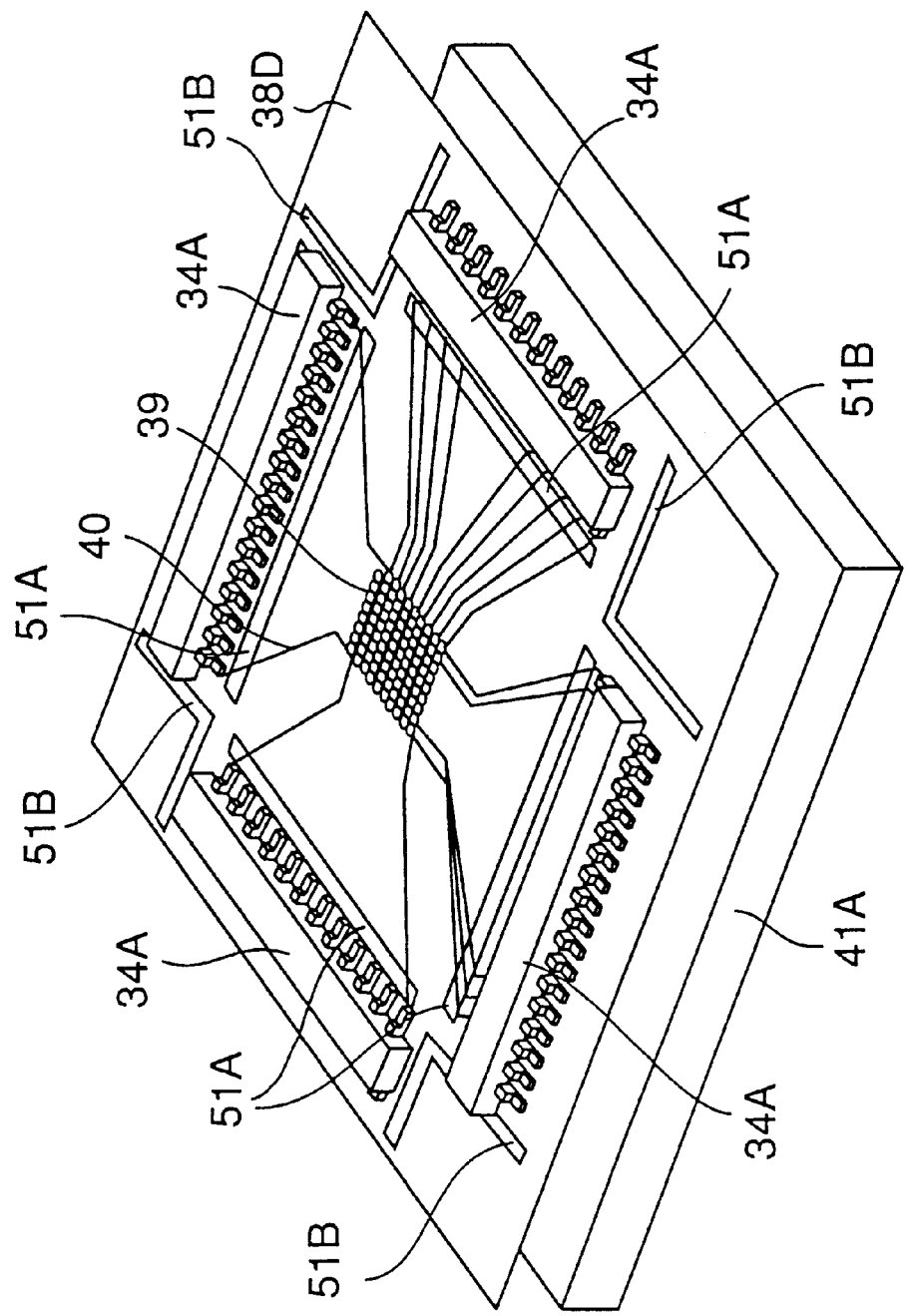
FIG. 20 illustrates a first modification of the attachment structure of the fifth embodiment of the present invention.
Figure 21:
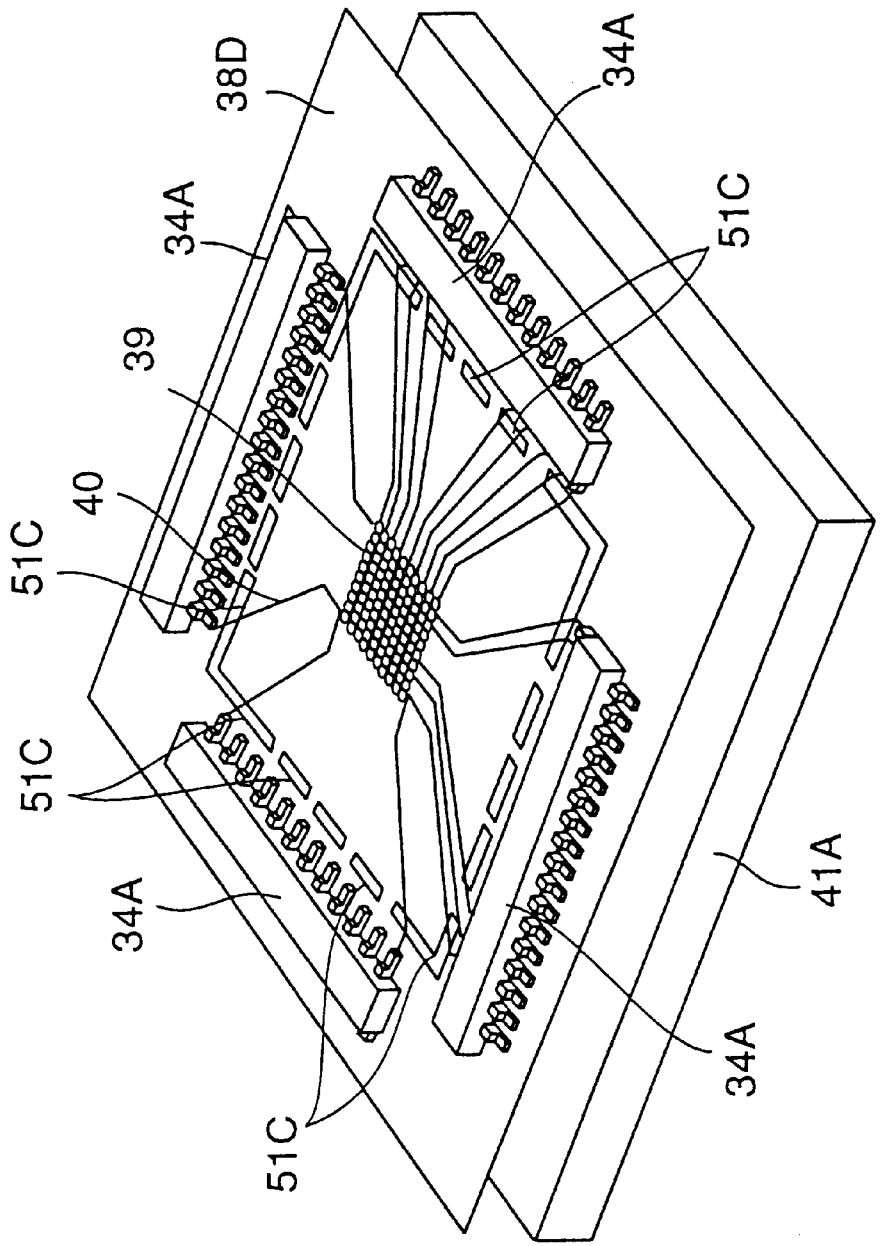
FIG. 21 illustrates a second modification of the attachment structure of the fifth embodiment of the present invention.

FIGS. 20 and 21 illustrate modifications of the fifth embodiment of the present invention.

The modification shown in FIG. 20 is characterized by the same clearances 51A as in the fifth embodiment and L-shaped clearances 51B situated between each pair of adjacent socket connectors 34A. With this structure, the contact film 38D can be further surely prevented from being displaced at the time of attaching and detaching the connectors.

The modification shown in FIG. 21 is characterized by clearances 51C formed at intervals in the contact film 38D. To ensure sufficient absorption of displacement, the clearances formed in the contact film 38D preferably have large areas. However, large clearances lower the strength of the contact film 38D, and often result in larger displacement. To avoid such a situation, this modification employs the clearances 51C at intervals in the contact film 38D. Thus, the contact film 38D can be prevented from decreasing in strength, and displacement in the contact film can be efficiently absorbed.

Figure 22:
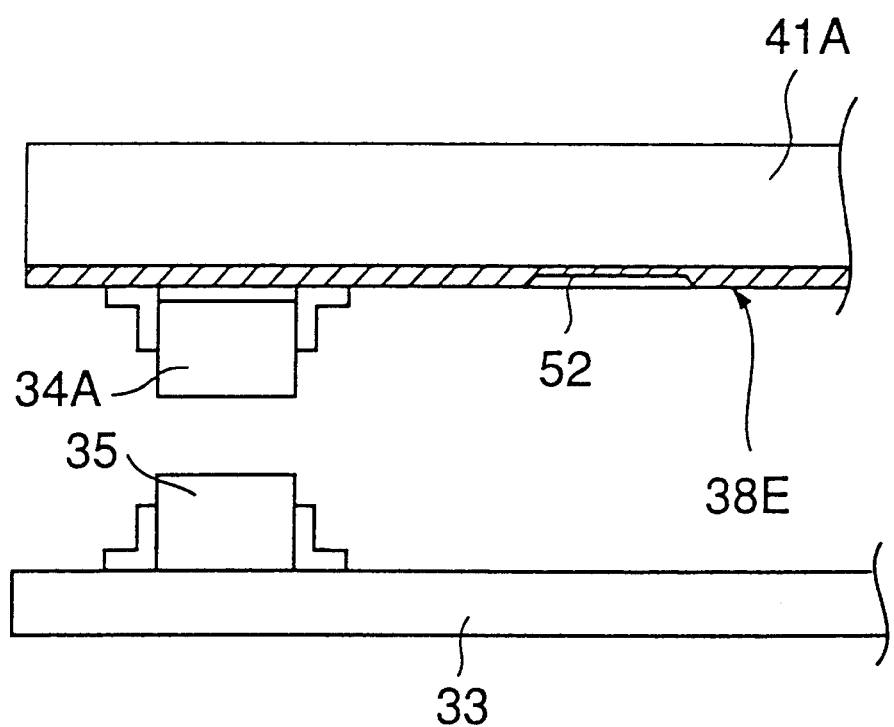
FIG. 22 is a side view of an attachment structure of a sixth embodiment of the present invention.

FIG. 22 illustrates an attachment structure of a sixth embodiment of the present invention. This embodiment is characterized by thin portions 52 formed as displacement absorbing portions in a contact film 38E. These thin portions 52 are formed by chemical etching, mechanical grinding, or laser processing. The thin portions 52 have more elasticity than the other parts of the contact film 38E, and can absorb displacement of the contact film 38E. Thus, the semiconductor device 1 can also be accurately and surely connected to the contact portion 39 in this embodiment.

Figure 23:
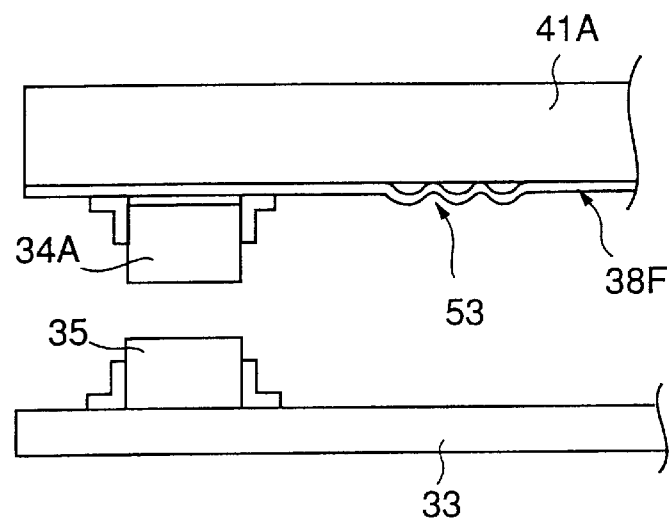
FIG. 23 is a side view of an attachment structure of a seventh embodiment of the present invention.
Figure 24:
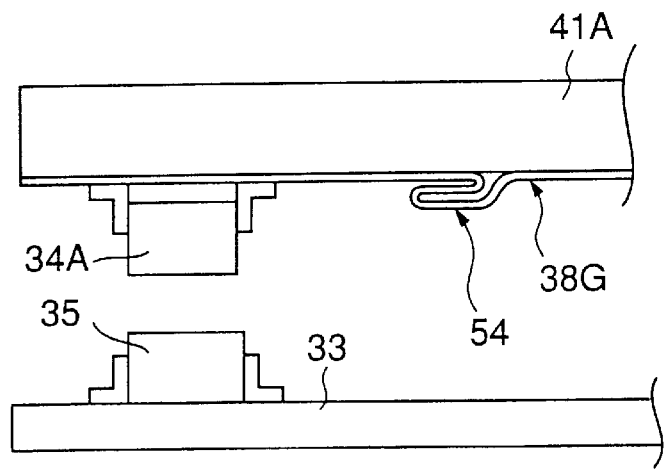
FIG. 24 is a side view of an attachment structure of an eighth embodiment of the present invention.

FIG. 23 illustrates an attachment structure of a seventh embodiment of the present invention. This embodiment is characterized by bellows 53 formed as displacement absorbing portions in a contact film 38F. FIG. 24 illustrates an attachment structure of an eighth embodiment of the present invention. This embodiment is characterized by overlapping portions 54 formed as displacement absorbing portions in a contact film 38G.

The bellows 53 and the overlapping portions 54 can be integrally formed at the time of forming the contact films 38F and 38G, respectively. Accordingly, the bellows 53 and the overlapping portions 54 do not complicate the production procedures of the contact films 38F and 38G.

The bellows 53 and the overlapping portions 54 can be deformed to absorb displacement of the contact films 38F and 38G, respectively. Thus, the semiconductor device 1 can also be accurately and surely connected to the contact portion 39 in the seventh and eighth embodiments.

Figure 25:
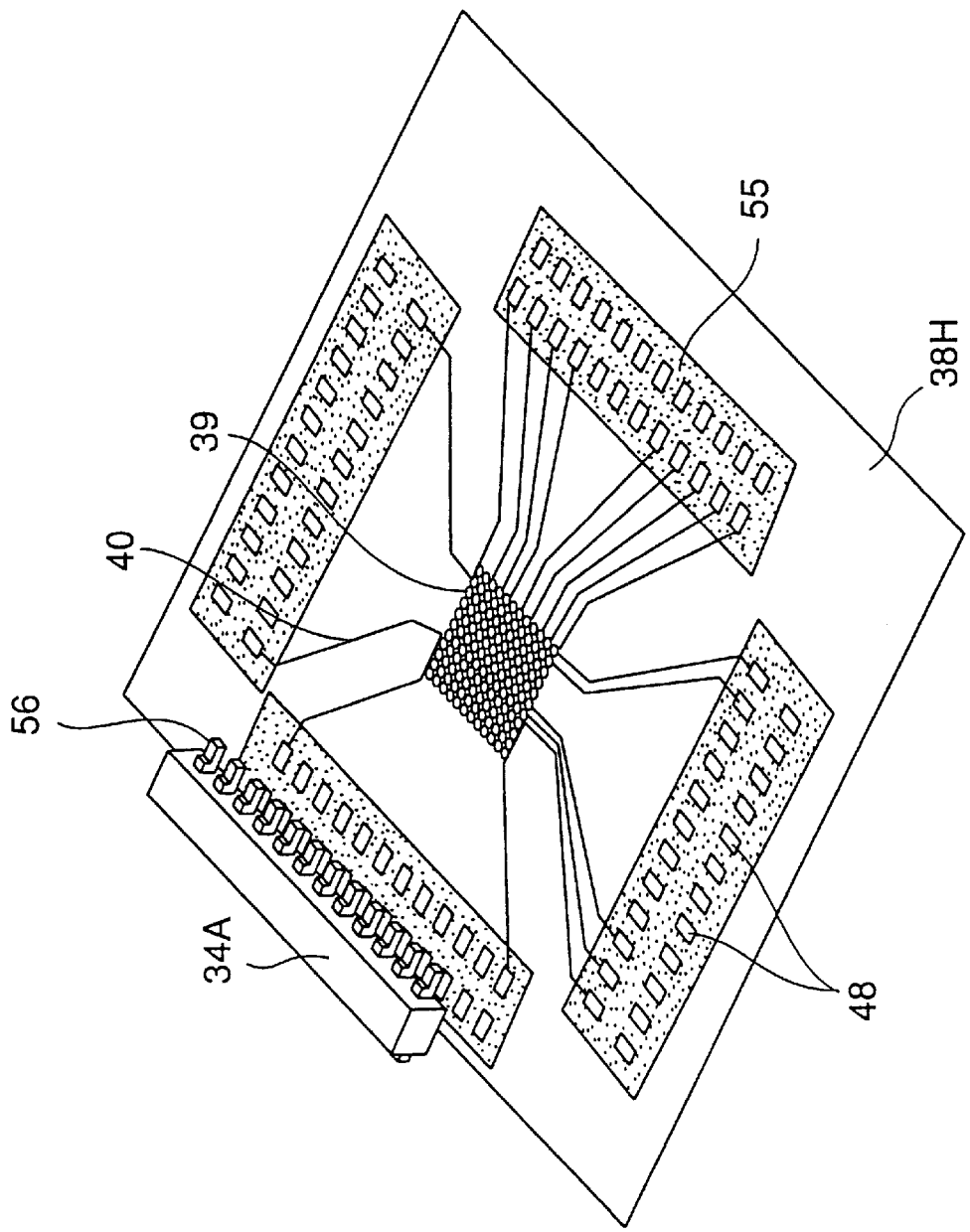
FIG. 25 shows a contact film used in an attachment structure of a ninth embodiment of the present invention.
Figure 26:
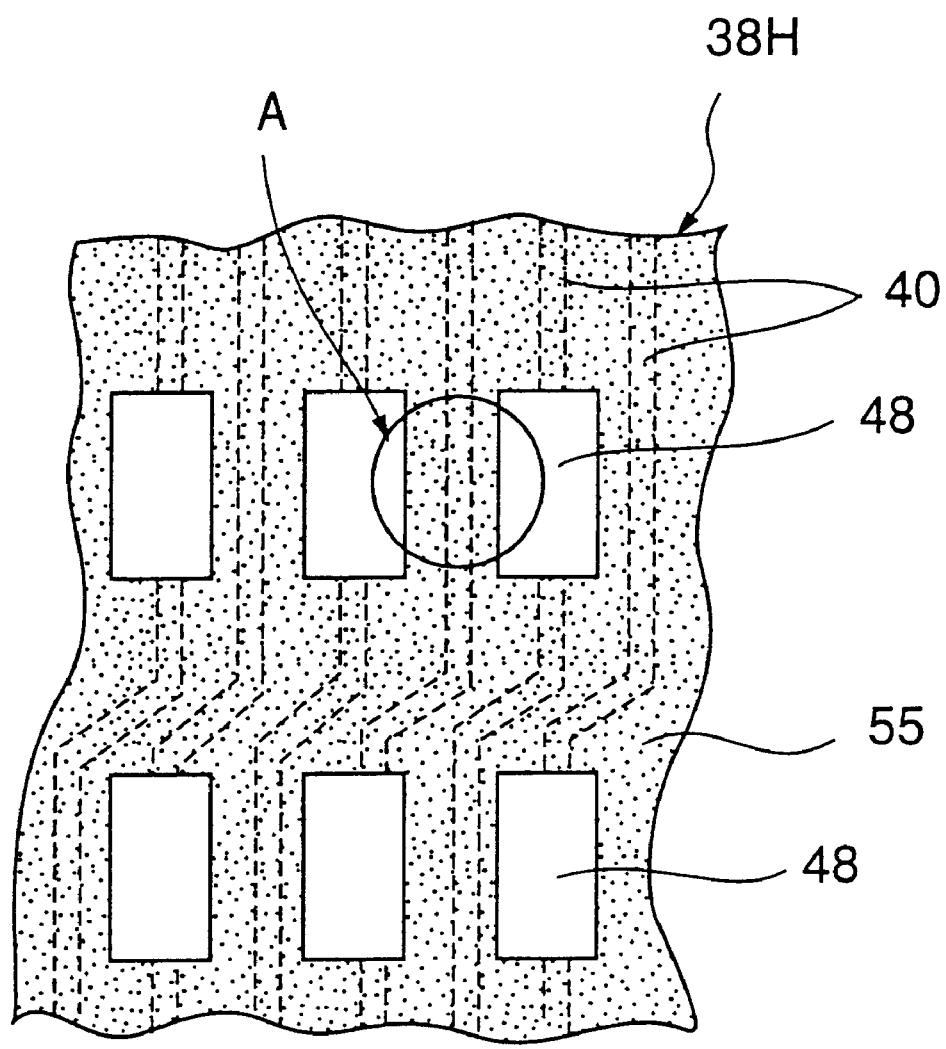
FIG. 26 is an enlarged view of connecting portions of the contact film of the ninth embodiment of the present invention.

FIGS. 25 and 26 illustrate an attachment structure of a ninth embodiment of the present invention. FIG. 25 shows a contact film 38H used in this embodiment, and FIG. 26 is an enlarged view of connection portions 48.

This embodiment is characterized by a solder insulating material 55 applied to connector mounting regions on the contact film 38H. The connector mounting regions are areas on which the socket connectors 34A are mounted. As shown in FIG. 26, the connector mounting regions are areas in which the extension conductive wires 40 are disposed at high density, and in which the connection portions 48 are formed. The connection electrodes 56 of the socket connectors 34A are soldered to the connection portions 48. Therefore, the connection portions 48 are formed in the vicinity of the extension conductive wires 40 in the formation positions of the connection portions 48 (for instance, a position indicated by an arrow A in FIG. 26).

If no solder insulating material 55 is employed in this structure, solder bridges are formed to cause short-circuiting between the adjacent connecting portions and extension conductive wires 40, and between the adjacent extension conductive wires 40 when the socket connectors 34A are soldered to the contact film 38H. To avoid such a situation, the solder insulating material 55 is applied to the connector mounting regions in this embodiment. The solder insulating material 55 has very little affinity for solder. When the solder insulating material 55 is applied, the connection portions 48 to which the socket connectors 34A are soldered are left exposed.

In the above manner, the solder insulating material 55 is formed between adjacent connection portions 48, and the extension conductive wires 40 are covered with the solder insulating material 55. Thus, a solder bridge (short-circuiting) between the connection portions 48 and the extension conductive wires 40 and between adjacent extension conductive wires 40 can be prevented, thereby achieving high reliability.

Although the upper portions of the extension conductive wires 40 are covered with the solder insulating material 55 in this embodiment, the extension conductive wires 40 may be exposed to achieve the same effects as in the case where no solder insulating material 55 is formed.

Figure 27:
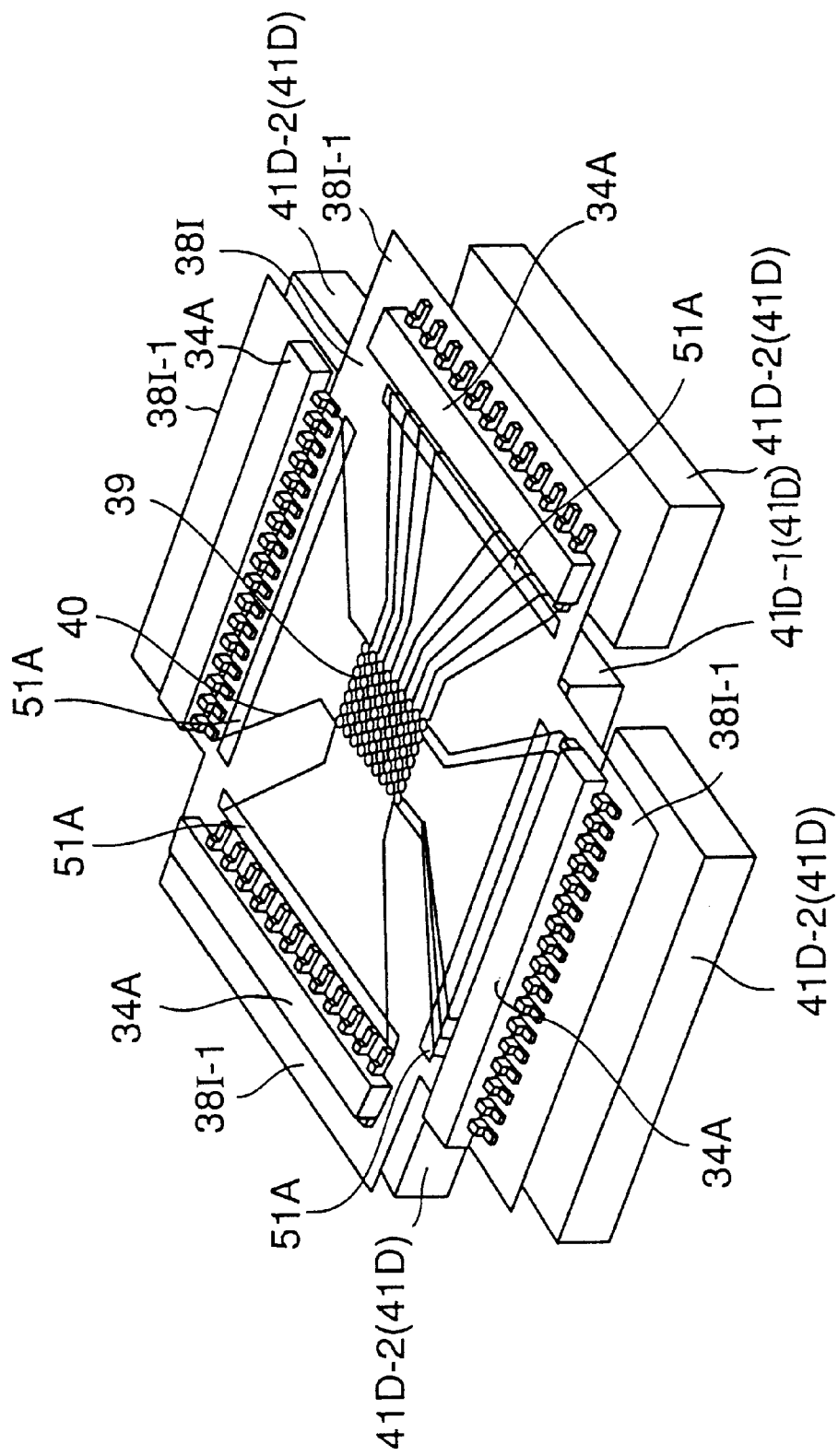
FIG. 27 illustrates an attachment structure of a tenth embodiment of the present invention.
Figure 28:
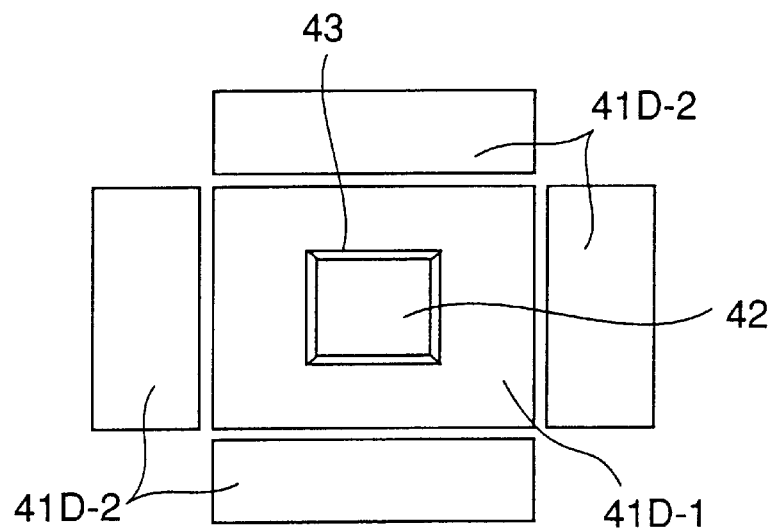
FIG. 28 shows a reinforcing board used in the attachment structure of the tenth embodiment of the present invention.
Figure 29:
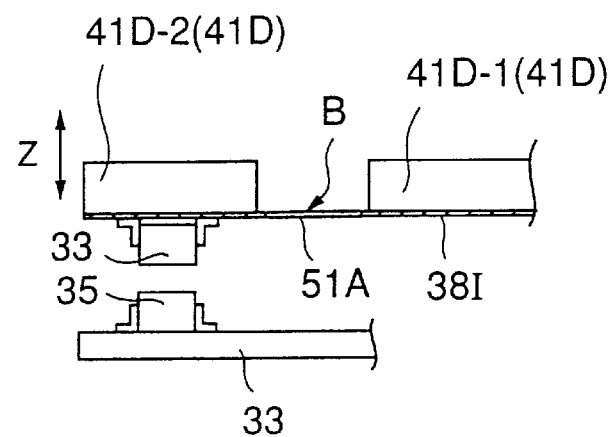
FIG. 29 is a side view of the attachment structure of the tenth embodiment of the present invention.

FIGS. 27 to 29 illustrate an attachment structure of a tenth embodiment of the present invention. FIG. 27 shows a contact film 38I being bonded to reinforcing boards 41D used in the attachment structure of this embodiment. FIG. 28 shows the reinforcing boards 41D used in the attachment structure of this embodiment. FIG. 29 is a side view of the attachment structure of this embodiment.

In the foregoing embodiments, each of the reinforcing boards 41A to 41C has a one-plate structure. On the other hand, the reinforcing board 41D of this embodiment is made up of a first reinforcing member 41D-1 and second reinforcing members 41D-2.

The first reinforcing member 41D-1 reinforces the region of the contact portion 39, and the opening 42 having the package guide 43 is formed in the center. The second reinforcing members 41D-2 reinforce the regions of the socket connectors 34A. In this embodiment, four socket connectors 34A are disposed. Accordingly, four second reinforcing members 41D-2 are employed in this embodiment. As shown in each figure, each of the second reinforcing members 41D-2 is completely separate from the first reinforcing member 41D-1. However, the first reinforcing member 41D-1 and the second reinforcing members 41D-2 are bonded to the same contact film 38I, and are thus connected via the contact film 38I. Accordingly, in this embodiment, the second reinforcing members 41D-2 can be displaced from the first reinforcing member 41D-1 in a direction indicated by an arrow Z in FIG. 29.

The contact film 38I of this embodiment has a cross-like shape in a plan view. Extending portions 38I-1 extend from the contact film 38I in four directions. Each of the extending portions 38I-1 is provided with one of the socket connectors 34A. The clearances 51A described in the fifth embodiment are also formed. Accordingly, the second reinforcing members 41D-2 can be readily displaced from the first reinforcing member 41D-1 in the Z-direction.

Since the reinforcing board 41D comprises the first reinforcing member 41D-1 and the second reinforcing members 41D-2 and the second reinforcing members 41D-2 provided with the socket connectors 34A can be displaced from the first reinforcing member 41D-1, the socket connectors 34A can be attached to and detached from the circuit substrate connectors 35 with a smaller force. The reasons for this are as follows:

As described so far, the socket connectors 34A contain a large number (n, for instance) of contacts. By engaging the contacts with the contacts of the circuit substrate connectors 35, the socket connectors 34A are connected to the circuit substrate connectors 35. At the time of this connection, an engaging force F is generated at the engaging portion between each pair of contacts, and therefore, a total force of F×n is required for attaching and detaching of the socket connectors 34A and the circuit substrate connectors 35. In this embodiment, the four socket connectors 34A are also attached to the contact film 38I. Accordingly, an even larger force, 4×F×n, is required for attachment and detachment between the semiconductor device socket and the test circuit substrate 33. If the reinforcing board has a one-plate structure, it is necessary to collectively carry out attachment and detachment of the four socket connectors 34A and circuit substrate connectors 35. Because a large force is required for the attachment and detachment, a too large engaging force F or a too large number of contacts might hinder the attachment and detachment of the socket connectors 34A and the circuit substrate connectors 35. To solve such a problem, the second reinforcing members 41D-2 can be displaced from the first reinforcing member 41D-1 in the Z-direction in this embodiment. Thus, each of the socket connectors 34A can be independently attached to or detached from each corresponding circuit substrate connector 35. This reduces the force required for attachment and detachment between the socket connectors 34A and the circuit substrate connectors 35 from 4×F×n to F×n. According to this embodiment, the force required for attachment and detachment between the socket connectors 34A and the circuit substrate connectors 35 can thus be reduced, and workability in attaching and detaching operations can be remarkably improved.

In this embodiment, the second reinforcing members 41D-2 are completely separate from the first reinforcing member 41D-1. However, as can be apparent from the above explanation, as long as the second reinforcing members 41D-2 can be displaced from the first reinforcing member 41D-1, the second reinforcing members 41D-2 may be connected to the first reinforcing members 41D-1. Also, in a case where the second reinforcing members 41D-2 are completely separate from the first reinforcing member 41D-1, a connection mechanism for connecting the reinforcing member 41D-1 and the reinforcing members 41D-2 may be employed, so that no excess stress is applied to the contact film 38I at the time of displacement.

The present invention is not limited to the specifically disclosed embodiments, but variations and modifications may be made without departing from the scope of the present invention.

The present application is based on Japanese priority applications No. 10-365591, filed on Dec. 22, 1998, and No.

11-321592, filed on Nov. 11, 1999, the entire contents of which are hereby incorporated for reference.

What is claimed is:

1. An attachment structure of a semiconductor device socket, comprising:

a socket body;

a circuit substrate to which the semiconductor device socket is attached;

a contact film formed in the socket body and provided with conductive wires and a contact portion to which a semiconductor device is connected;

socket connectors connected to the conductive wires formed on the contact film; and circuit substrate connectors formed on the circuit substrate for connections with the socket connectors, wherein the socket connectors and the circuit substrate connectors are in a male-female connector relationship.

2. The attachment structure as claimed in claim 1, wherein the semiconductor device socket is secured to the circuit substrate by virtue of a bonding force caused between the socket connectors and the circuit substrate connectors at the time of connecting.

3. The attachment structure as claimed in claim 1, wherein:

the contact film bonded to the semiconductor device socket is provided with a plurality of contact portions; and a plurality of socket connectors corresponding to the plurality of contact portions are formed on the contact film.

4. The attachment structure as claimed in claim 1, wherein a solder insulating material is applied at least to connector mounting regions on the contact film, with soldering portions of the socket connectors being exposed.

5. The attachment structure as claimed in claim 1, wherein the contact film is provided with displacement absorbing portions which absorb displacement of the contact film caused when the socket connectors are attached to or detached from the circuit substrate connectors.

6. The attachment structure as claimed in claim 5, wherein the displacement absorbing portions are clearances, bellows, overlapping portions, or thin portions, formed in the contact film.

7. The attachment structure as claimed in claim 1, wherein the semiconductor device socket is further provided with a reinforcing member which reinforces the contact film and has an opening in a position corresponding to the contact portion.

8. The attachment structure as claimed in claim 7, wherein the opening functions as a positioning guide for positioning the semiconductor device to the contact portion.

9. The attachment structure as claimed in claim 7, wherein:

the reinforcing member has protrusions formed in positions corresponding to the positions of the socket connectors; and the contact film is bonded along the protrusions so as to form the socket connectors.

10. The attachment structure as claimed in claim 7, wherein the socket body is provided with a fixing mechanism for detachably fixing the reinforcing member thereto.

11. The attachment structure as claimed in claim 7, wherein:

the reinforcing member comprises a first reinforcing portion for reinforcing the position of the contact portion, and second reinforcing portions for reinforcing the positions of the socket connectors; and the second reinforcing portions can be displaced from the first reinforcing portion.

* * * * *